(12) United States Patent
Kang

(10) Patent No.: US 6,850,447 B2
(45) Date of Patent: Feb. 1, 2005

(54) NONVOLATILE FERROELECTRIC MEMORY DEVICE HAVING MULTI-BIT CONTROL FUNCTION

(75) Inventor: Hee Bok Kang, Daejeon (KR)

(73) Assignee: Hynix Semiconductor Inc., Gyeonggi-do (KR)

(*) Notice: Subject to any disclaimer, the term of this patent is extended or adjusted under 35 U.S.C. 154(b) by 0 days.

(21) Appl. No.: 10/731,099

(22) Filed: Dec. 10, 2003

(65) Prior Publication Data
US 2004/0233696 A1 Nov. 25, 2004

(30) Foreign Application Priority Data
May 23, 2003 (KR) .................. 10-2003-0032902

(51) Int. Cl.[7] .............................................. G11C 7/14
(52) U.S. Cl. .................. 365/210; 365/145; 365/168; 365/220; 365/209; 365/189.07; 365/51; 365/65; 365/230.03; 365/203; 365/189.02; 365/239

(58) Field of Search ................. 365/145, 168, 365/220, 210, 209, 207, 189.07, 51, 66, 65, 63, 230.03, 203, 189.02, 239

(56) References Cited

U.S. PATENT DOCUMENTS 6,067,265 A * 5/2000 Mukunoki et al. .......... 365/210
6,587,367 B1 * 7/2003 Nishimura et al. ......... 365/145

* cited by examiner

Primary Examiner—Andrew Q. Tran
(74) Attorney, Agent, or Firm—Heller Ehrman White and McAuliffe LLP

(57) ABSTRACT

A nonvolatile ferroelectric memory device having a multi-bit control function performs read/write operations by selecting a plurality of cells simultaneously, thereby improving the operation speed of a chip. In the nonvolatile ferroelectric memory device, a plurality of cells are selected at the same time, and stable sensing values of data having a small distribution can be obtained by using average characteristics of a plurality of selected cells. Accordingly, since two or more cells are simultaneously selected and a plurality of bits are read/written in the cells depending on stabilized charge, the operation speed of a chip can be improved.

20 Claims, 32 Drawing Sheets

NONVOLATILE FERROELECTRIC MEMORY DEVICE HAVING MULTI-BIT CONTROL FUNCTION

BACKGROUND OF THE INVENTION

1. Field of the Invention

The present invention generally relates to a nonvolatile ferroelectric memory device having a multi-bit control function, and more specifically, to a technology for selecting a plurality of cells simultaneously and performing data read/write operations using average characteristics of the selected plurality of cells, thereby improving chip operation speed.

2. Description of the Prior Art

Generally, a ferroelectric random access memory (hereinafter, referred to as 'FRAM') has attracted considerable attention as next generation memory device because it has a data processing speed as fast as a Dynamic Random Access Memory DRAM and conserves data even after the power is turned off.

The FRAM having structures similar to the DRAM includes the capacitors made of a ferroelectric substance, so that it utilizes the characteristic of a high residual polarization of the ferroelectric substance in which data is not deleted even after an electric field is eliminated.

The technical contents on the above FRAM are disclosed in the Korean Patent Application No. 2002-85533 by the same inventor of the present invention. Therefore, the basic structure and the operation on the FRAM are not described herein.

FIG. 1 is a diagram showing a structure of a conventional nonvolatile ferroelectric memory cell.

The conventional nonvolatile ferroelectric memory cell comprises transistors T1 and T2, and ferroelectric capacitors FC1 and FC2. This configuration is called as a '2T2C' (2-Transistor, 2-Capacitor) structure.

The transistor T1, connected between a bitline /BL and a first electrode of the ferroelectric capacitor FC1, has a gate connected to a wordline WL. A second electrode of the ferroelectric capacitor FC1 is connected to a plateline PL. The transistor T2, connected between a bitline BL and a first electrode of the ferroelectric capacitor FC2, has a gate connected to the wordline WL. A second electrode of the ferroelectric capacitor FC2 is connected to the plateline PL.

Here, a pair of bitlines BL and /BL are connected in common to a sense amplifier S/A1. The ferroelectric capacitors FC1 and FC2 store opposite data. One of data is stored in two memory device.

FIG. 2 is a characteristic curve showing a hysteresis loop of a conventional nonvolatile ferroelectric memory cell.

Referring to FIG. 2, in a normal cell, the charge of data "1" is D and the charge of data "0" is A. However, in an abnormal cell, the charge of data "1" is C and the charge of data "0" is B. In the abnormal cell, the data margin of data "1" and "0" represents a minimum value.

When the conventional nonvolatile ferroelectric memory cell having a 2T2C structure has both normal data and abnormal data, a characteristic of a cell is determined by that of abnormal data. As a result, when a cell has a characteristic of abnormal data, it is difficult to distinguish data "1" from data "0" accurately, thereby causing a data failure.

Due to miniaturization of design rule of a semiconductor memory, the cell size becomes smaller. However, as the cell size becomes smaller, it is difficult to maintain the characteristic of a cell. In addition, if the semiconductor memory has a large distribution due to different characteristics of the cell, the minimum sensing margin of data is reduced. As a result, it is impossible to drive a chip rapidly.

SUMMARY OF THE INVENTION

Accordingly, it is an object of the present invention to obtain a stable sensing value of data having a small distribution by using average characteristics of a plurality of cells.

It is another object of the present invention to improve the operation speed of a nonvolatile ferroelectric memory by selecting two or more cells simultaneously to read/write multi-bit in a memory cell depending on stabilized sensing values.

In an embodiment, a nonvolatile ferroelectric memory device having a multi-bit control function comprises a plurality of memory cells, a plurality of column selecting switches, a common data bus unit and a sense amplifier. The plurality of memory cells are connected to a plurality of bitlines to be activated simultaneously. The plurality of column selecting switches are connected one by one to the plurality of bitlines. The common data bus unit is connected in common to the plurality of column selecting switches. The sense amplifier compares a reference voltage level with a voltage level of averaged data applied through the common data bus unit and amplifies the comparison result. The averaged data is averages of charge values applied from the plurality of memory cells via the plurality of column selecting switches.

In an embodiment, a nonvolatile ferroelectric memory device having a multi-bit control function comprises a plurality of cell array blocks, a common data bus unit and a plurality of sense amplifiers. The plurality of cell array blocks to be activated simultaneously, comprise a plurality of column selecting switches connected one by one to a plurality of main bitlines. The common data bus unit is connected in common to the plurality of cell array blocks. The plurality of sense amplifiers compare reference voltage levels with voltage levels of a plurality of averaged data applied through the common data bus unit, and amplify the comparison data to output multi-bit data having different voltage levels. The plurality of cell array blocks are arranged side by side at a half side divided by the common data bus unit.

In an embodiment, a nonvolatile ferroelectric memory device having a multi-bit control function comprises a plurality of cell array blocks, a common data bus unit and a plurality of sense amplifiers. The plurality of cell array blocks to be activated simultaneously, comprise a plurality of column selecting switches connected one by one to a plurality of main bitlines. The common data bus unit is connected in common to the plurality of cell array blocks. The plurality of sense amplifiers compare and amplify different reference voltage levels with voltage levels of a plurality of averaged data applied from the plurality of cell array blocks, and outputting multi-bit data having different voltage levels. The plurality of cell array blocks are arranged side by side at both half-sides divided by the common data bus unit.

DETAILED DESCRIPTION OF THE PREFERRED EMBODIMENTS

The present invention will be described in detail with reference to the accompanying drawings.

Figure 1:
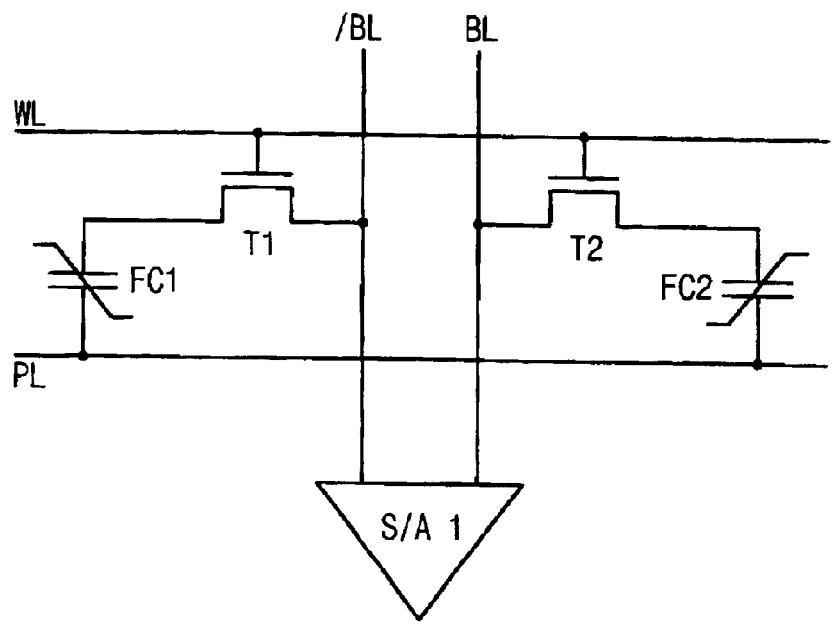
FIG. 1 is a diagram showing a structure of a conventional nonvolatile ferroelectric memory cell.
Figure 2:
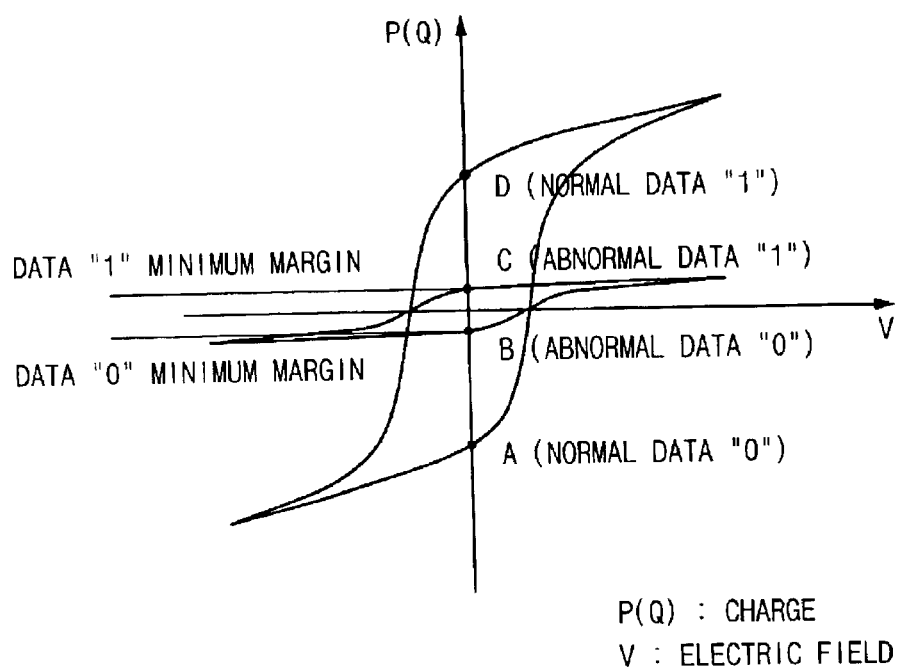
FIG. 2 is a characteristic curve showing a hysteresis loop of a conventional nonvolatile ferroelectric memory cell.
Figure 3:
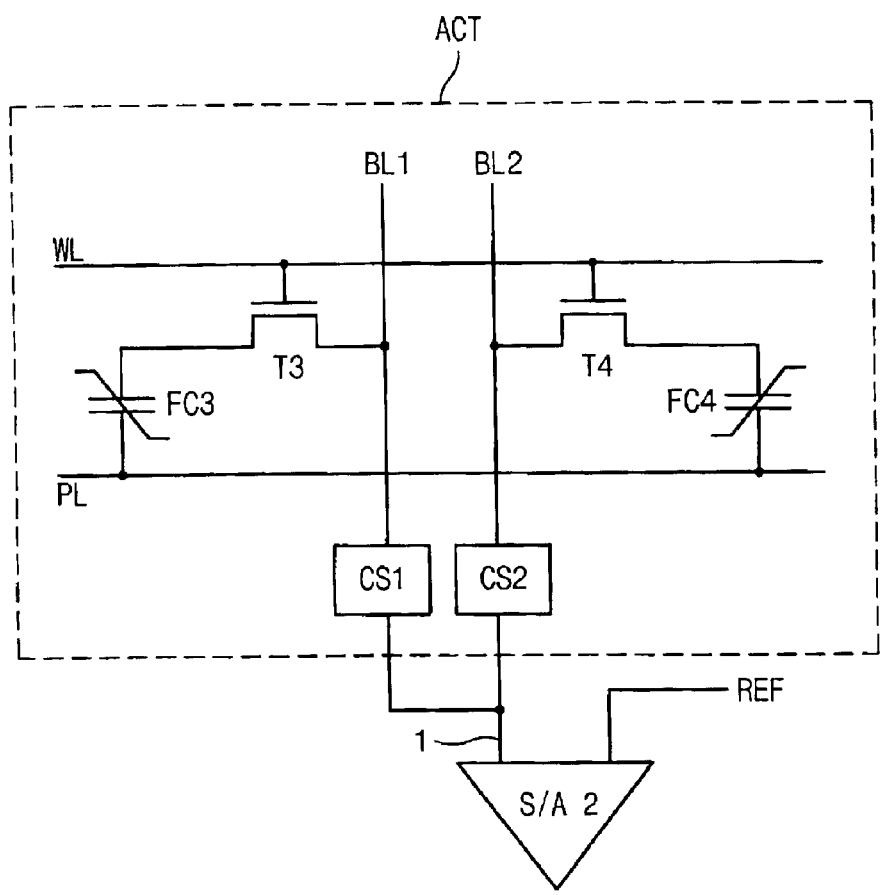
FIG. 3 is a diagram showing a structure of a nonvolatile ferroelectric memory cell having a multi-bit control function according to an embodiment of the present invention.

FIG. 3 is a diagram showing a structure of a nonvolatile ferroelectric memory cell having a multi-bit control function according to an embodiment of the present invention.

In an embodiment, the nonvolatile ferroelectric memory cell comprises transistors T3 and T4, and ferroelectric capacitors FC3 and FC4. This configuration is called as a '2T2C' (2-transistor, 2-capacitor) structure.

The transistor T3, connected between a bitline BL1 and a first electrode of the ferroelectric capacitor FC3, has a gate connected to a wordline WL. A second electrode of the ferroelectric capacitor FC3 is connected to a plateline PL.

The transistor T4, connected between a bitline BL2 and a first electrode of the ferroelectric capacitor FC4, has a gate connected to the wordline WL. A second electrode of the ferroelectric capacitor FC4 is connected to the plateline PL. Memory devices having a 2T2C structure are activated at the same time. The ferroelectric capacitors FC3 and FC4 store the same data. Hereinafter, a memory cell region activated simultaneously is represented by "ACT".

The bitline BL1 is connected to a column selecting switch CS1, and the bitline BL2 is connected to the column selecting switch CS2. The column selecting switches CS1 and CS2 are connected in common to a sense amplifier S/A2 through a common data bus 1. The common data bus 1 averages values of two cell data transmitted from the column selecting switches CS1 and CS2. The sense amplifier S/A2 compares and amplifies a reference voltage REF with a voltage of averaged data applied from the common data bus 1.

Each charge value of two cell data applied from the column selecting switches CS1 and CS2 is averaged, a voltage level of averaged data is outputted into the common data bus 1.

Figure 4:
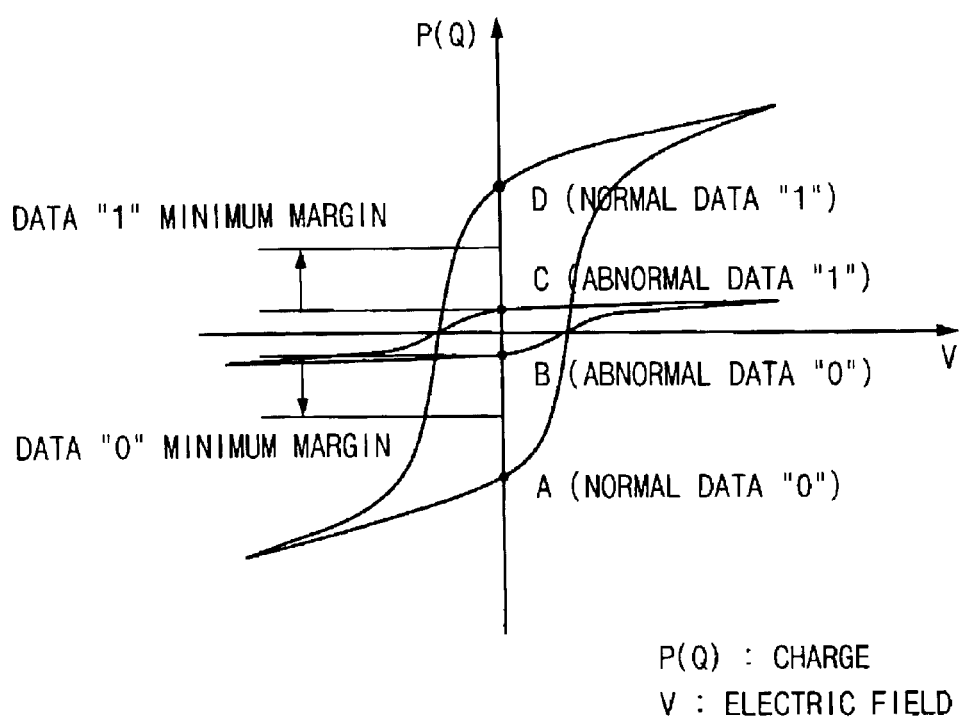
FIG. 4 is a characteristic curve showing a hysteresis loop of a nonvolatile ferroelectric memory cell according to an embodiment of the present invention.

FIG. 4 is a characteristic curve showing a hysteresis loop of a nonvolatile ferroelectric memory cell according to an embodiment of the present invention.

Referring to FIG. 4, in a normal cell, the charge of data "1" is D, and the charge of data "0" is A. In an abnormal cell, the charge of data "1" is C, and the charge of data "0" is B. The ferroelectric capacitors FC3 and FC4 store the same data. The sense amplifier S/A2 averages the charge of the same data applied from the bitlines BL1 and BL2.

When one of the cells is normal, the average margin of the two cells has an intermediate value between normal data and abnormal data. As a result, the two cells can secure the fixed margin. Therefore, even when the memory device according to an embodiment of the present invention has an abnormal cell, the memory device can secure sensing data with an over predetermined margin by average values of normal cells.

Figure 5:
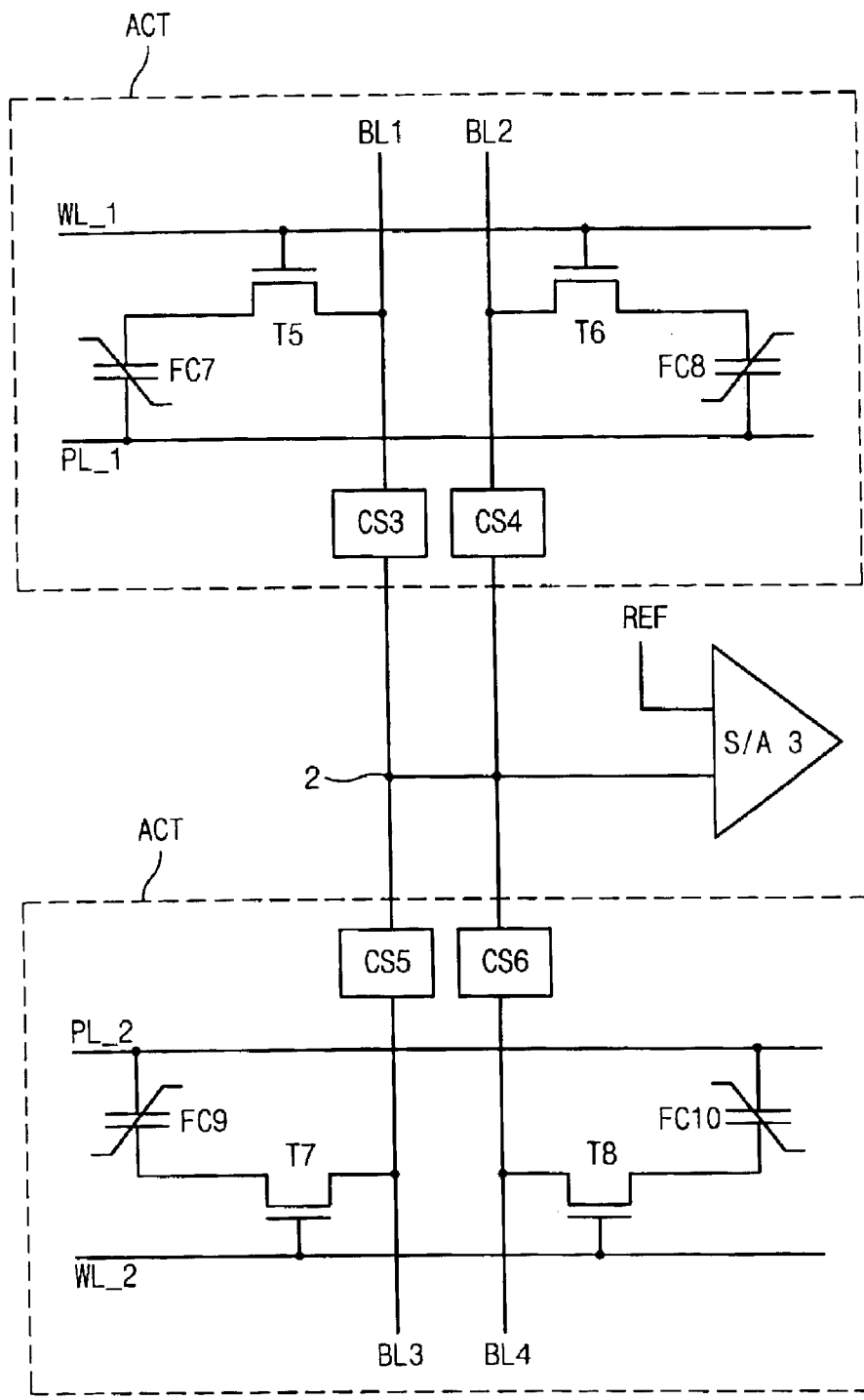
FIG. 5 is a diagram showing a structure of a nonvolatile ferroelectric memory having a multi-bit control function according to another embodiment of the present invention.

FIG. 5 is a diagram showing a structure of a nonvolatile ferroelectric memory having a multi-bit control function according to another embodiment of the present invention.

In an embodiment of FIG. 5, the nonvolatile ferroelectric memory cell comprises transistors T5~T8, and ferroelectric capacitors FC7~FC10. This configuration is called as a '4T4C' structure.

The transistor T5, connected between a bitline BL1 and a first electrode of the ferroelectric capacitor FC7, has a gate connected to a wordline WL__1. A second electrode of the ferroelectric capacitor FC7 is connected to a plateline PL__1. The transistor T6, connected between a bitline BL2 and a first electrode of the ferroelectric capacitor FC8, has a gate connected to the wordline WL__1. A second electrode of the ferroelectric capacitor FC8 is connected to the plateline PL__1.

The transistor T7, connected between a bitline BL3 and a first electrode of the ferroelectric capacitor FC9, has a gate connected to a wordline WL__2. A second electrode of the ferroelectric capacitor FC9 is connected to a plateline PL__2. The transistor TB, connected between the bitline BL3 and a first electrode of the ferroelectric capacitor FC10, has a gate connected to the wordline WL__2. A second electrode of the ferroelectric capacitor FC10 is connected to the plateline PL__2.

The bitline BL1 is connected to a column selecting switch CS3, and the bitline BL2 is connected to a column selecting switch CS4. The bitline BL3 is connected to a column selecting switch CS5, and the bitline BL4 is connected to a column selecting switch CS6. The column selecting switches CS3~CS6 are connected in common to a sense amplifier S/A3 through a common data bus 2. The sense amplifier S/A3 averages values of four cell data applied through the column selecting switches CS3~CS6 by the reference voltage REF.

Memory devices having a 4T4C structure are activated simultaneously. The ferroelectric capacitors FC7~FC10 store the same data.

The sense amplifier S/A3 averages the charge of the same data applied from the bitlines BL1~BL4. When at least one of the four cells is normal, the constant margin can be secured depending on the average of four cells. Even when the memory device according to an embodiment of the present invention has an abnormal cell, the memory device can secure sensing data with an over predetermined margin by average values of normal cells.

Figure 6:
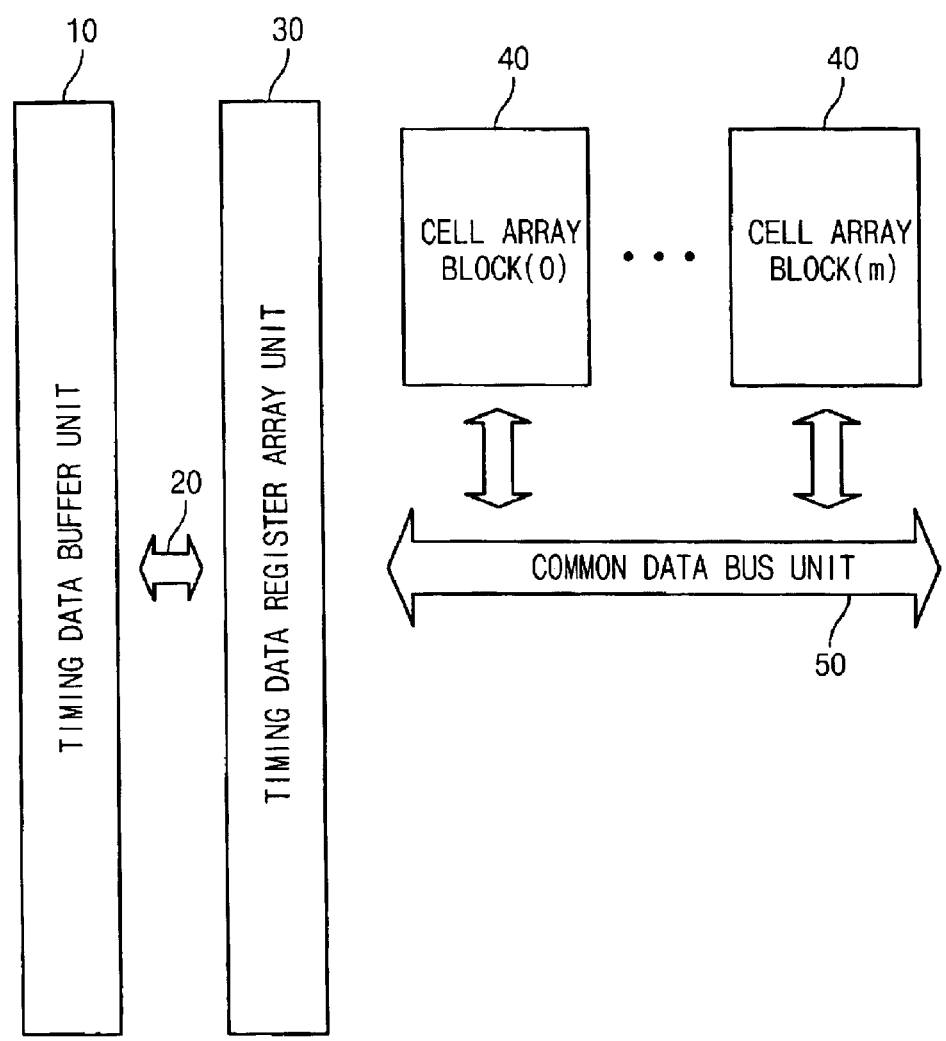
FIGS. 6 and 7 are block diagrams illustrating examples of a nonvolatile ferroelectric memory device having a multi-bit function according to an embodiment of the present invention.

FIG. 6 is a block diagram illustrating an example of a nonvolatile ferroelectric memory device having a multi-bit function according to an embodiment of the present invention.

In this example, the nonvolatile ferroelectric memory device comprises a timing data buffer unit 10, a data buffer bus unit 20, a timing data register array unit 30, a plurality of cell array blocks 40 and a common data bus unit 50.

The timing data buffer unit 10 is connected to the timing data register array unit 30 through the data buffer bus unit 20. The plurality of cell array blocks 40 share the common data bus unit 50 connected to the timing data register array unit 30.

In a read mode, data read in the cell array block 40 are stored in the timing data register array unit 30 through the common data bus unit 50. The read data stored in the timing data register array unit 30 are outputted into the timing data buffer unit 10 through the data buffer bus unit 20.

In a write mode, data inputted through the timing data buffer unit 10 are stored in the timing data register array unit 30 through the data buffer bus unit 20. The input data or write data stored in the timing data register array unit 30 are written in the cell array block 40 through the common data bus unit 50.

Here, the timing data buffer unit 10 and the timing data register array unit 30 split data with multiple time by timing axis conversion. As a result, a plurality of data, controlled by timing axis conversion, can be written and read in the cell array block 40.

Figure 7:
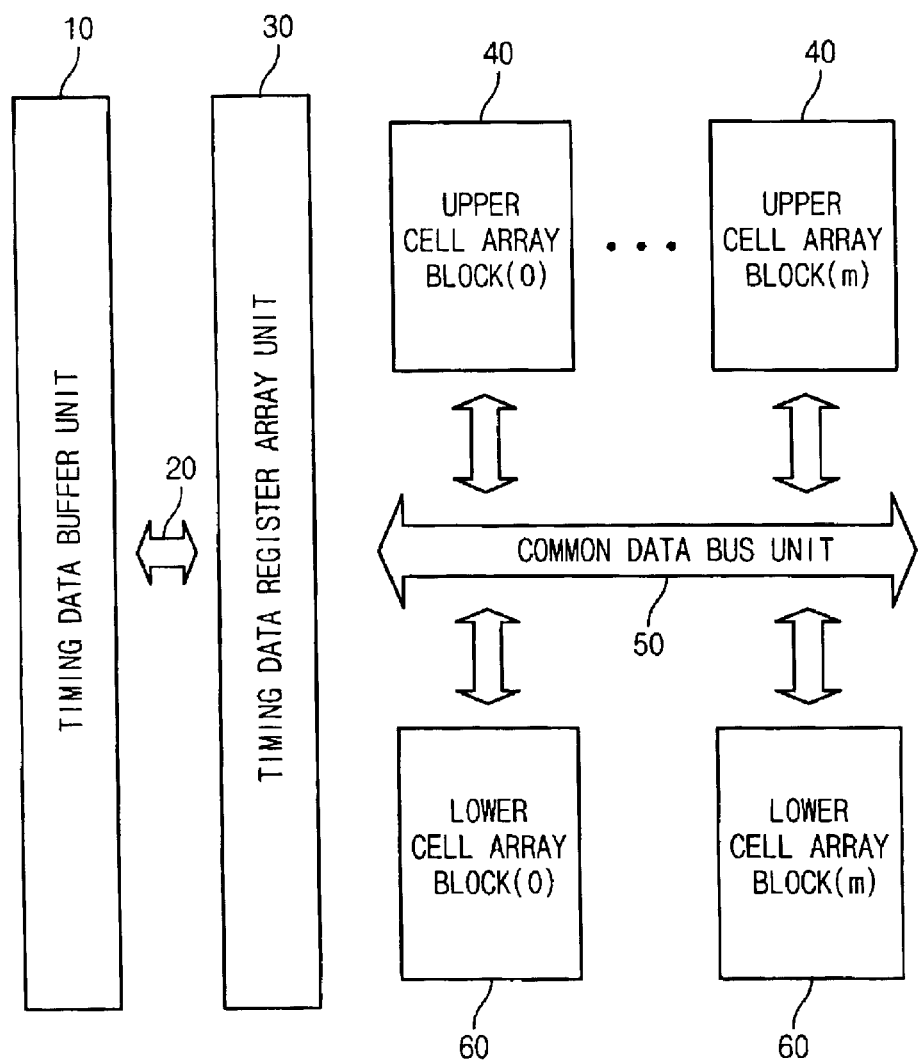

FIG. 7 is a block diagram illustrating another example of a nonvolatile ferroelectric memory device having a multi-bit function according to an embodiment of the present invention.

In this example, the nonvolatile ferroelectric memory device comprises a timing data buffer unit 10, a data buffer bus unit 20, a timing data register array unit 30, a plurality of upper cell array blocks 40, a common data bus unit 50 and a plurality of lower cell array blocks 60.

The timing data buffer 10 is connected to the timing data register array unit 30 through the data buffer bus unit 20. The plurality of upper cell array blocks 40 and the plurality of lower cell array blocks 60 share the common data bus unit 50. The common data bus unit 50 is connected to the timing data register array unit 30.

In a read operation, read data outputted from the upper cell array block 40 or the lower cell array block 60 are stored in the timing data register array unit 30 through the common data bus unit 50. The read data stored in the timing data register array unit 30 are outputted into the read/write data buffer unit 10 through the data buffer bus unit 20.

In a write mode, input data inputted through the timing data buffer unit 10 are stored in the timing data register array unit 30 through the data buffer bus unit 20. Input data stored in the timing data register array unit 30 are written in the upper cell array block 40 or the lower cell array block 60 through the common data bus unit 50. The write data stored in the timing data register array unit 30 can be restored in the upper cell array block 40 or the lower cell array block 60.

Here, the timing data buffer unit 10 and the timing data register array unit 30 split data with multiple time by timing axis conversion. As a result, a plurality of data, controlled by timing axis conversion, can be written and read in the cell array block 40.

Figure 8:
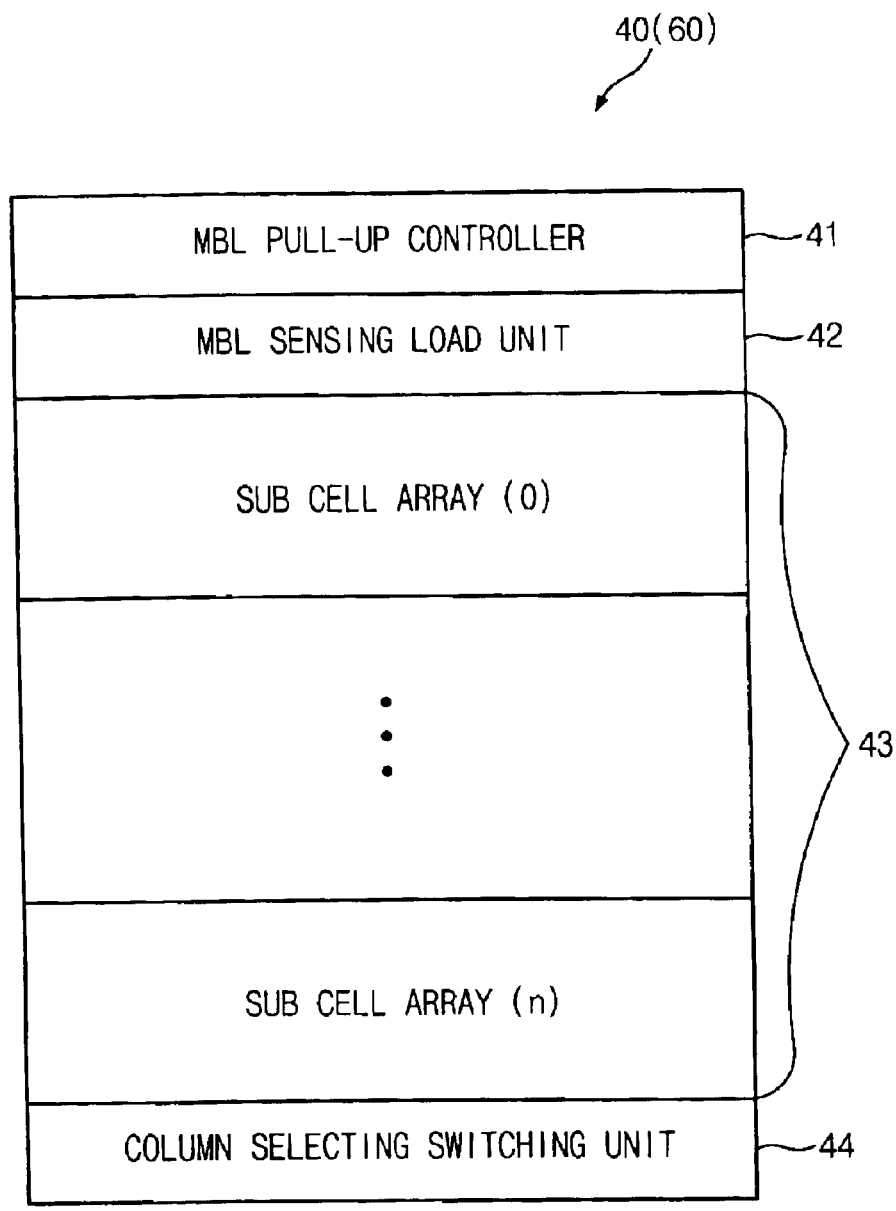
FIG. 8 is a diagram illustrating a cell array block of FIGS. 6 and 7.

FIG. 8 is a diagram illustrating the cell array block 40 or 60 of FIGS. 6 and 7.

Since the lower cell array block 60 has the same structure as that of the upper cell array block 40, the upper cell array block 40 of FIG. 6 is exemplified.

The cell array block 40 has a main bitline (MBL) pull-up controller 41, a main bitline sensing load unit 42, a plurality of sub cell arrays 43 and a column selecting switching unit 44. Here, the plurality of sub cell arrays 43 are connected to the common data bus unit 50 through the column selecting switching unit 44.

Figure 9:
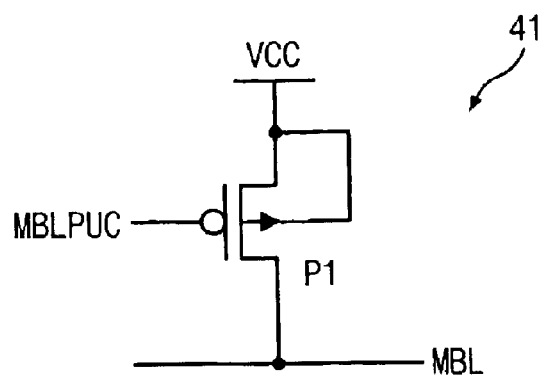
FIG. 9 is a circuit diagram illustrating a main bitline pull-up controller of FIG. 8.

FIG. 9 is a circuit diagram illustrating the main bitline pull-up controller 41 of FIG. 8.

The main bitline pull-up controller 41 comprises a PMOS transistor P1 for pulling up a main bitline MBL in a precharge mode. The PMOS transistor P1 has a source connected to a power voltage VCC terminal, a drain connected to the main bitline MBL and a gate to receive a main bitline pull-up control signal MBLPUC.

Figure 10:
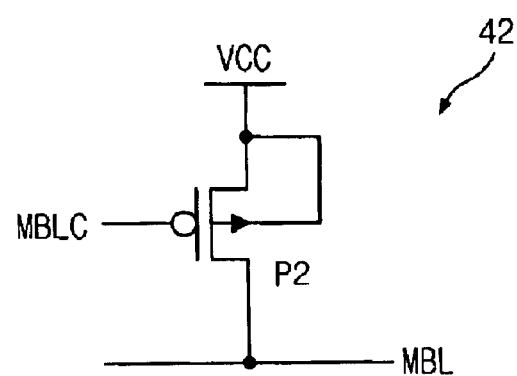
FIG. 10 is a circuit diagram illustrating a main bitline sensing load unit of FIG. 8.

FIG. 10 is a circuit diagram illustrating the main bitline sensing load unit 42 of FIG. 8.

The main bitline sensing load unit 42 comprises a PMOS transistor P2 for controlling sensing load of the main bitline MBL. The PMOS transistor P2 has a source connected to the power voltage VCC terminal, a drain connected to the main bitline MBL and a gate to receive a main bitline control signal MBLC.

Figure 11:
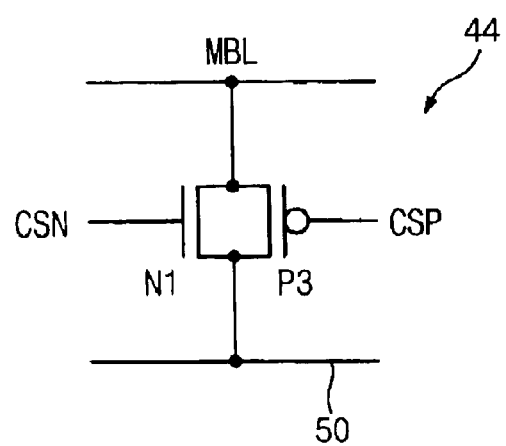
FIG. 11 is a circuit diagram illustrating a column selecting switch unit of FIG. 8.

FIG. 11 is a circuit diagram illustrating the column selecting switch unit 44 of FIG. 8.

The column selecting switching unit 44 comprises an NMOS transistor N1 and a PMOS transistor P3. The NMOS transistor N1, connected between the main bitline MBL and the common data bus 50, has a gate to receive a column selecting signal CSN. The PMOS transistor P3, connected between the main bitline MBL and the common data bus unit 50, has a gate to receive a column selecting signal CSP.

When the column selecting signals CSN and CSP are activated, the column selecting switching unit 44 is turned on to connect the common data bus unit 50 to the main bitline MBL.

Figure 12:
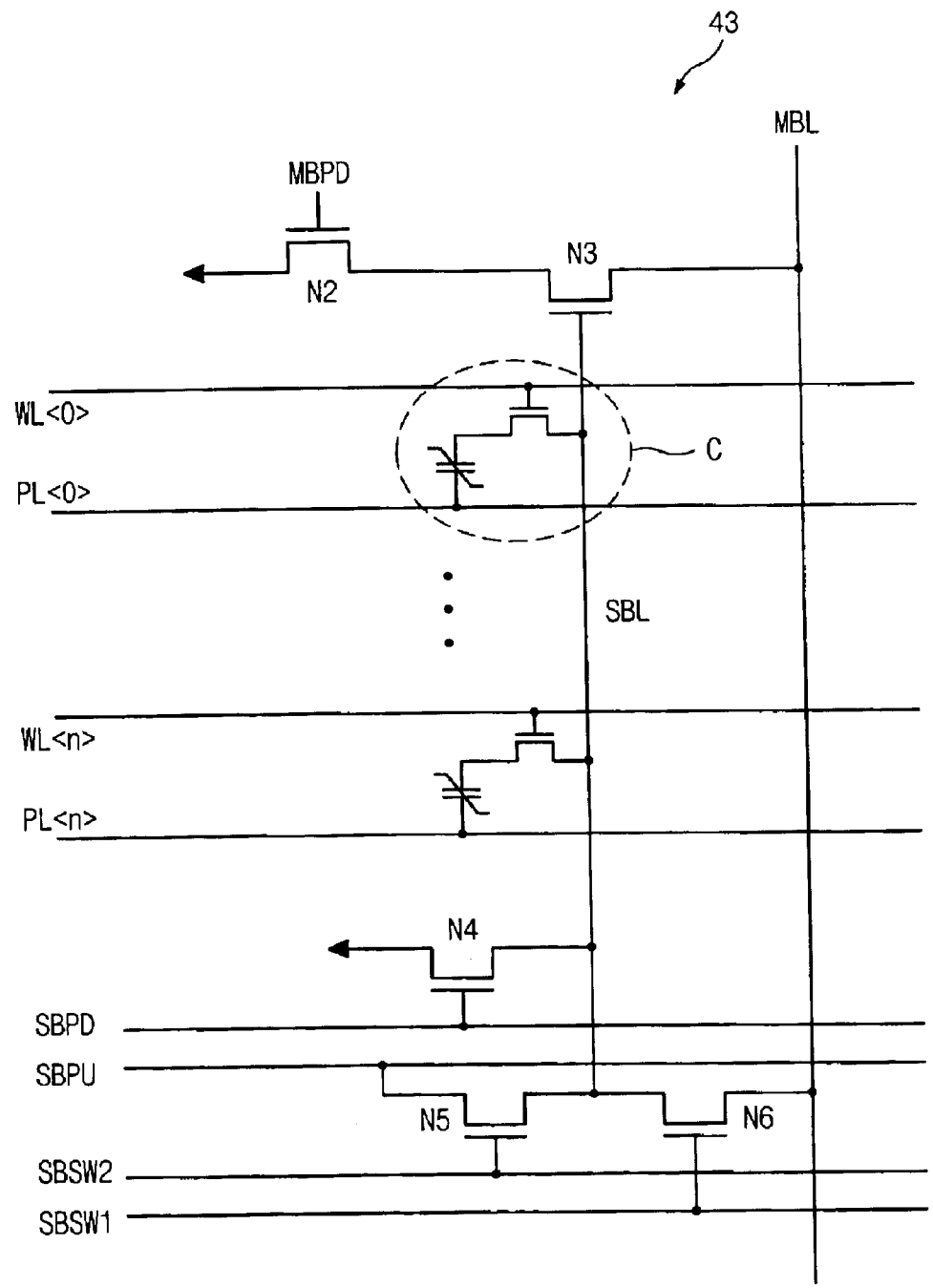
FIG. 12 is a circuit diagram illustrating a sub cell array of FIG. 8.

FIG. 12 is a circuit diagram illustrating the sub cell array 43 of FIG. 8.

Each main bitline MBL of the sub cell array 43 is selectively connected to one of a plurality of sub bitlines SBL. When a sub bitline selecting signal SBSW1 is activated, an NMOS transistor N6 is turned on to activate one sub bitline SBL. One sub bitline SBL is connected to a plurality of cells C.

When a sub bitline pull-down signal SBPD is activated, the NMOS transistor N4 is turned on to pull down the sub bitline SBL to a ground level. A sub bitline pull-up signal SBPU is to control power supplied to the sub bitline SBL. In a low voltage state, the sub bitline pull-up signal SBPU generates a voltage higher than the power voltage VCC and supplies the voltage to the sub bitline SBL.

A sub bitline selecting signal SBSW2 controls connection between a sub bitline pull-up signal SBPU terminal and the sub bitline SBL depending on switching of an NMOS transistor N5.

An NMOS transistor N3, connected between an NMOS transistor N2 and the main bitline MBL, has a gate connected to the sub bitline SBL. The NMOS transistor N2, connected between a ground voltage terminal and the NMOS transistor N3, has a gate to receive a main bitline pull-down signal MBPD, thereby regulating a sensing voltage of the main bitline MBL.

Figure 13:
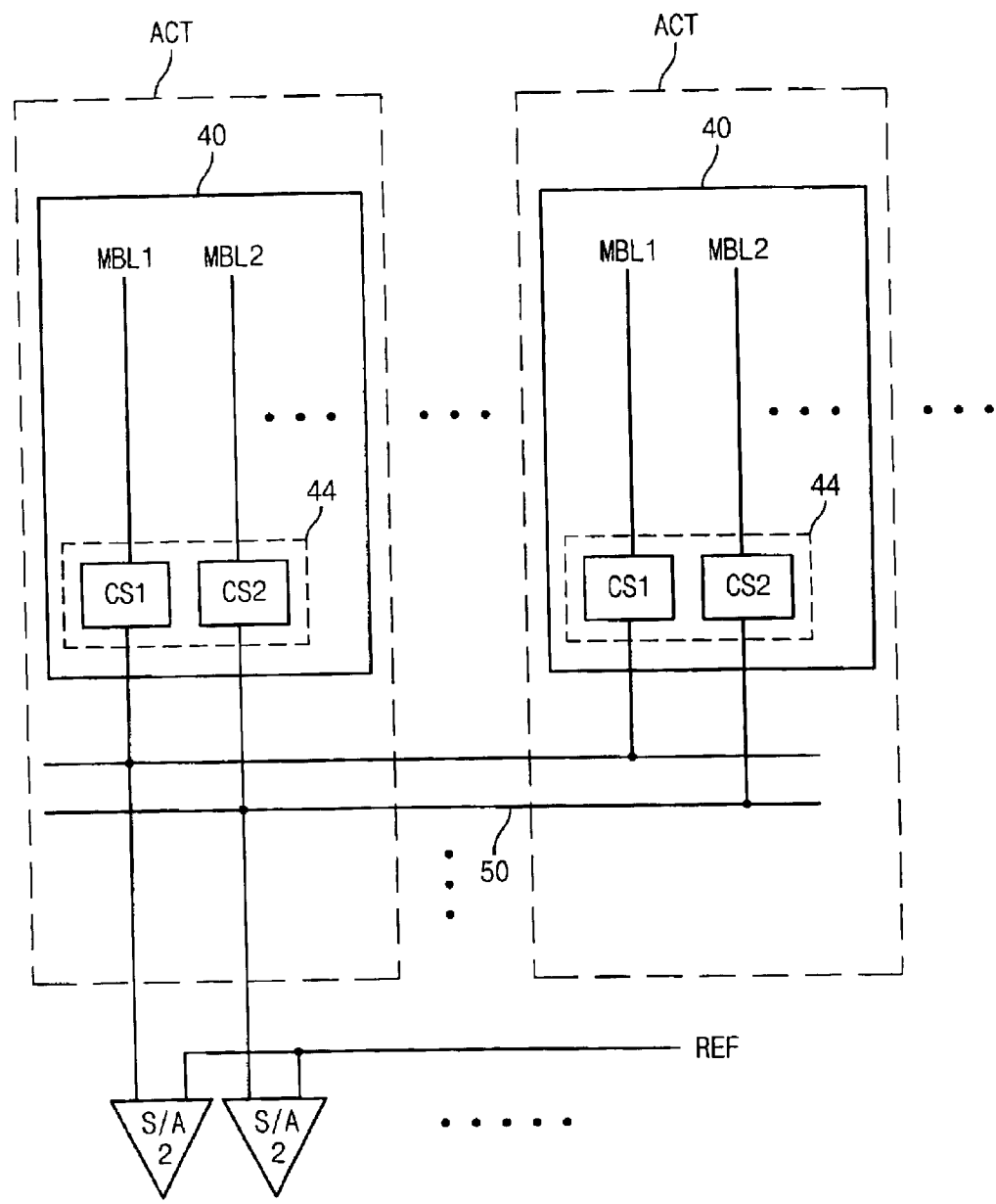
FIG. 13 is a diagram illustrating a cell array having a 2T2C structure according to an embodiment of the present invention.

FIG. 13 is a diagram illustrating a cell array having a 2T2C structure according to an embodiment of the present invention.

In an embodiment of FIG. 13, a plurality of cell array blocks 40 having a 2T2C structure are arranged horizontally. In the plurality of cell array blocks 40, the main bitlines MBL are connected one by one to the column selecting switching units 44. The plurality of column selecting switching units 44 are connected to the sense amplifiers S/A2 through the common data bus unit 50. One sense amplifier S/A2 averages cell data applied from the two column selecting switching units 44.

When the two cell array blocks 40 are activated at the same time, each cell of the two cell array blocks 40 read/write the same data through the common data bus unit 50. The embodiment of FIG. 13 has a 2T2C structure as shown in FIG. 3.

Figure 14:
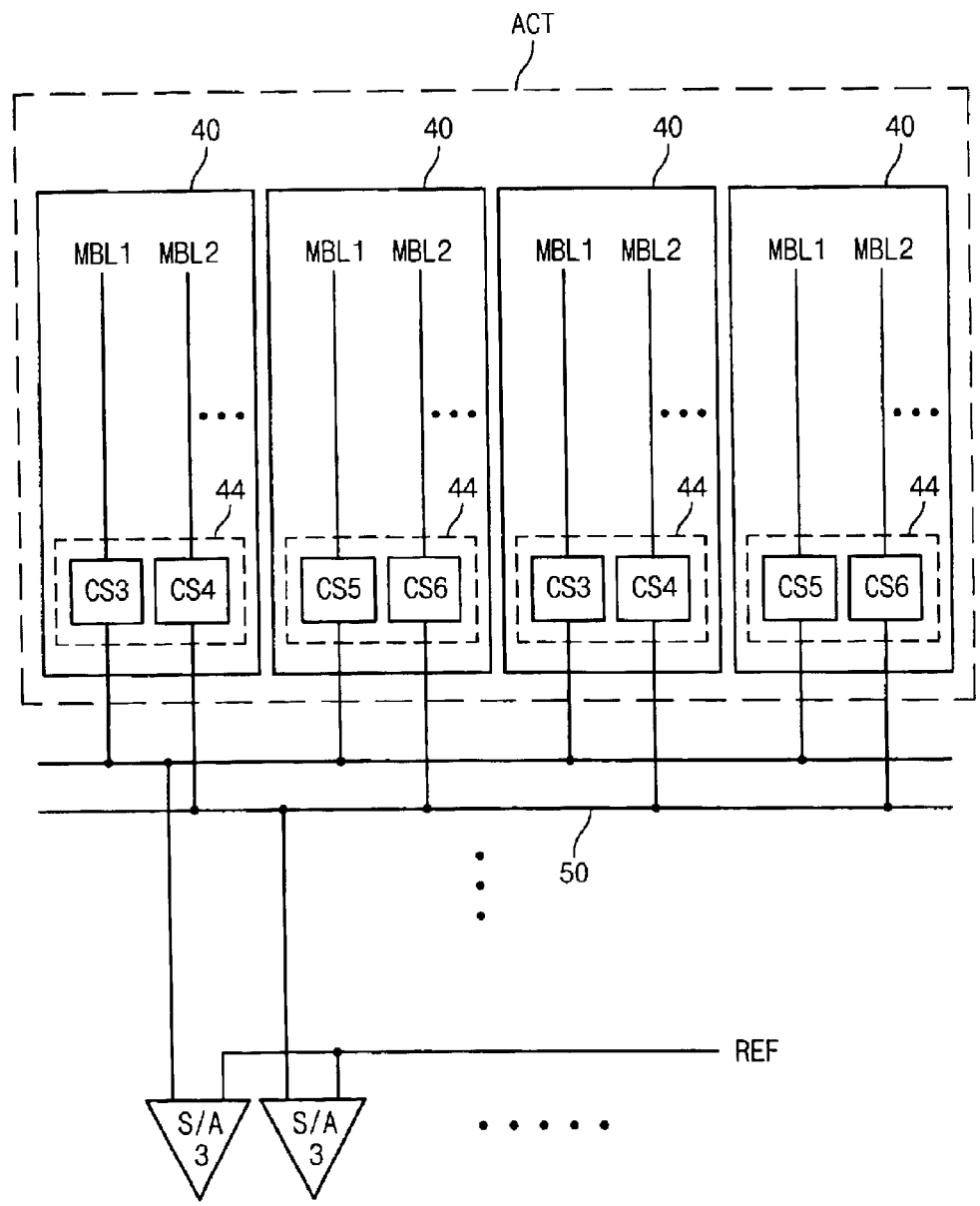
FIG. 14 is a diagram illustrating a cell array having a 4T4C structure according to an embodiment of the present invention.

FIG. 14 is a diagram illustrating a cell array having a 4T4C structure according to an embodiment of the present invention.

In an embodiment of FIG. 14, a plurality of cell array blocks 40 having a 4T4C structure are arranged horizontally. In the plurality of cell array blocks 40, the main bitlines MBL are connected one by one to the column selecting switching units 44. The plurality of column selecting switching units 44 are connected to the sense amplifiers S/A3 through the common data bus unit 50. One sense amplifier S/A3 averages cell data applied from the four column selecting switching units 44.

When the four cell array blocks 40 are activated at the same time, each cell of the four cell array blocks 40 read/write the same data through the common data bus unit 50. The embodiment of FIG. 14 has a 4T4C structure as shown in FIG. 5.

Figure 15:
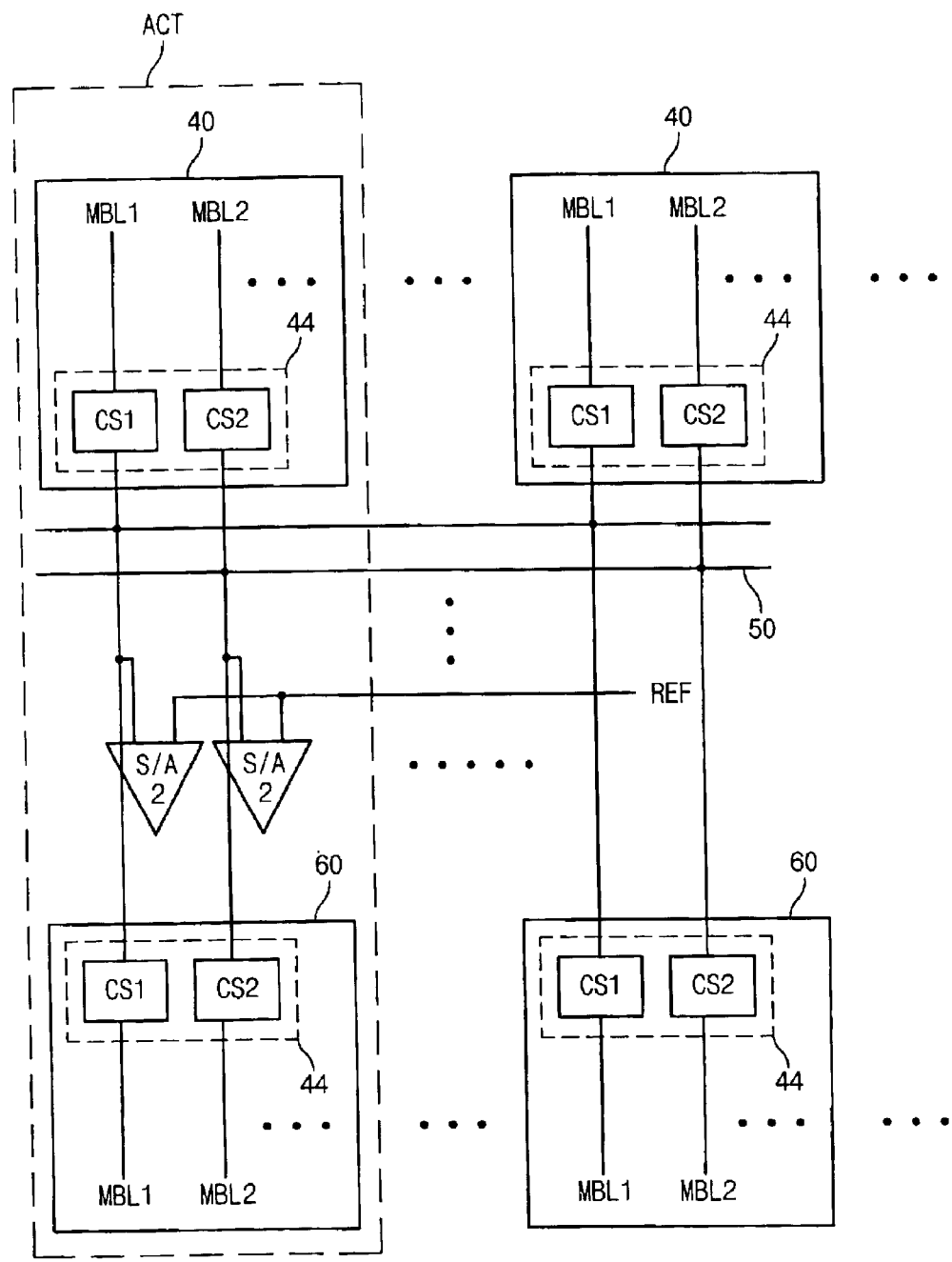
FIG. 15 is a diagram illustrating a cell array having a 2T2C structure according to another embodiment of the present invention.

FIG. 15 is a diagram illustrating a cell array having a 2T2C structure according to another embodiment of the present invention.

In an embodiment of FIG. 15, a plurality of upper cell array blocks 40 having a 2T2C structure are arranged horizontally, and a plurality of lower cell array blocks 60 having a 2T2C structure are arranged horizontally. Each upper cell array block 40 is arranged perpendicular to each lower cell array block 60. In the plurality of upper cell array blocks 40 and lower cell array blocks 60, the main btilines MBL are connected one by one to the column selecting switching units 44. The plurality of column selecting switching units 44 are connected to the sense amplifiers S/A2 through the common data bus unit 50. One sense amplifier S/A2 averages cell data applied from the activated two column selecting switching units 44.

Here, when the upper cell array block 40 and the lower cell array block 60 connected vertically each other are both activated at the same time, each cell of the upper cell array block 40 and the lower cell array block 60 reads/writes the same data through the common data bus unit 50. The embodiment of FIG. 15 has a 2T2C structure as shown in FIG. 3.

Figure 16:
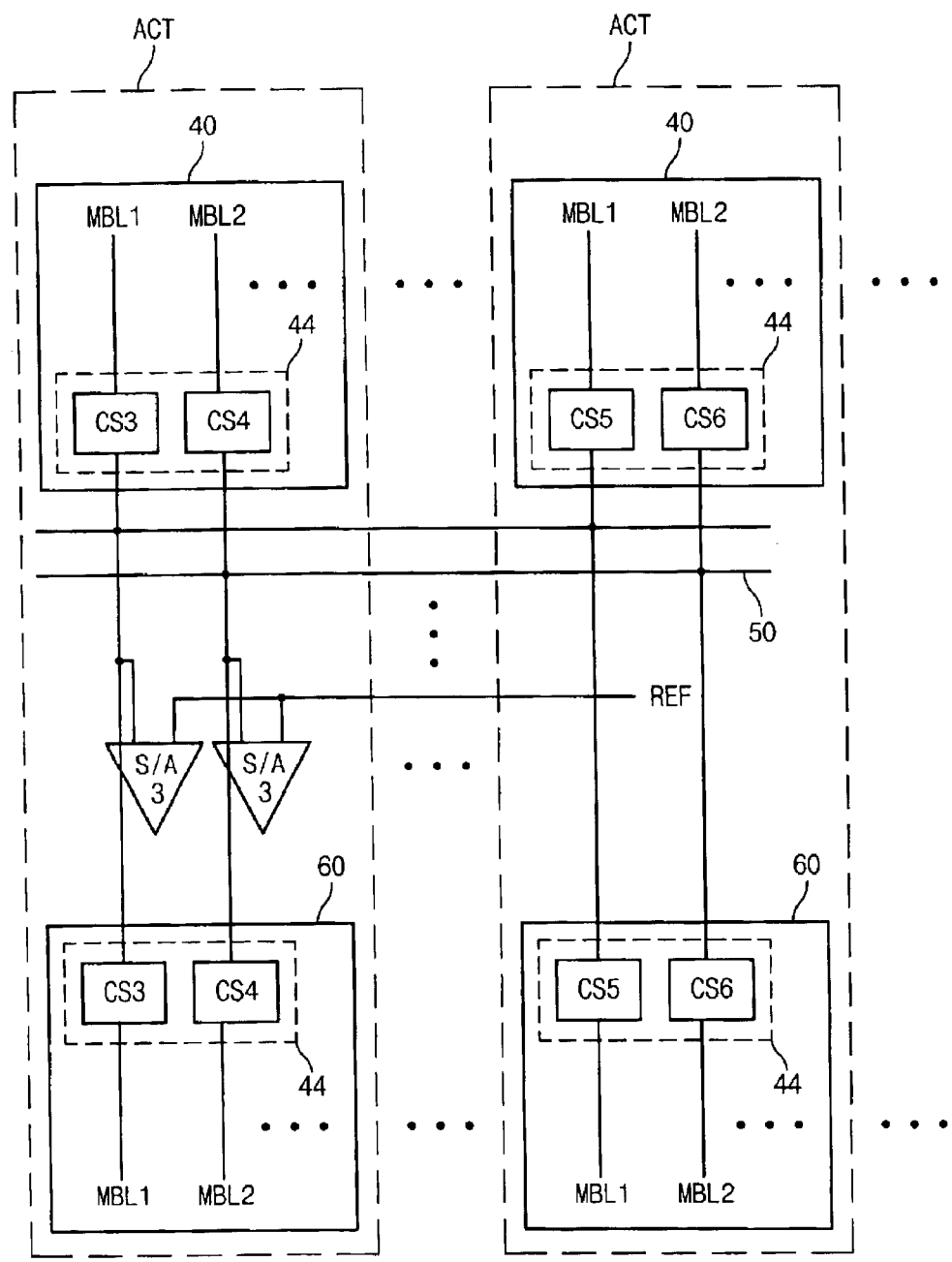
FIG. 16 is a diagram illustrating a cell array having 4T4C structure according to another embodiment of the present invention.

FIG. 16 is a diagram illustrating a cell array having 4T4C structure according to another embodiment of the present invention.

In an embodiment of FIG. 16, a plurality of upper cell array blocks 40 having a 4T4C structure are arranged horizontally, and a plurality of lower cell array blocks 60 having a 4T4C structure are arranged horizontally. Each upper cell array block 40 is arranged perpendicular to each lower cell array block 60. In the plurality of upper cell array blocks 40 and lower cell array blocks 60, the main bitlines MBL are connected one by one to the column selecting switching units 44. The plurality of column selecting switching units 44 are connected to the sense amplifiers S/A3 through the common data bus unit 50. One sense amplifier S/A3 averages cell data applied from the four column selecting switching units 44.

Here, when the upper cell array block 40 and the lower cell array block 60 connected vertically each other are both activated at the same time, each cell of the two upper cell array blocks 40 and the two lower cell array blocks 60 read/write the same data through the common data bus unit 50. The embodiment of FIG. 16 has a 4T4C structure as shown in FIG. 5.

Figure 17:
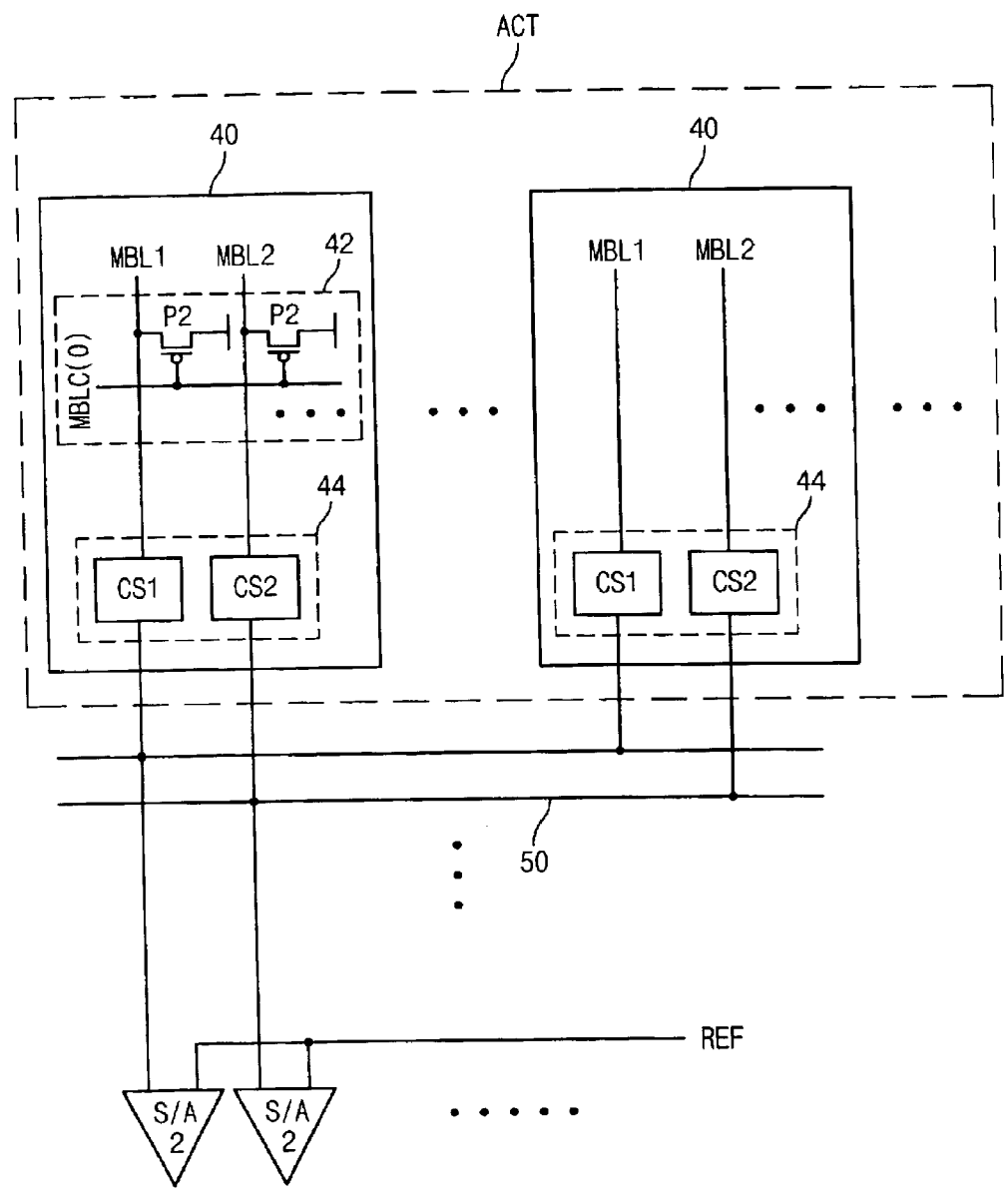
FIGS. 17 and 18 are diagrams illustrating an example of a cell array applied to FIG. 13.

FIG. 17 is a diagram illustrating an example of one cell array block of FIG. 13 further comprising one main bitline sensing load unit 42.

In an embodiment of FIG. 17, one of the two activated cell array blocks 40 comprises the main bitline sensing load unit 42 connected to the main bitlines MBL. Here, the main bitline sensing load unit 42 can be selectively connected depending on characteristics of the cell. The main bitlines MBL connected to the main bitline sensing load unit 42 receive loading voltages, thereby improving sensing margin.

As a result, since the maximum value of the sensing margin is secured depending on the main bitline sensing load unit 42 connected to the activated cell array block 40, the voltage of the main bitline MBL can be determined.

Figure 18:
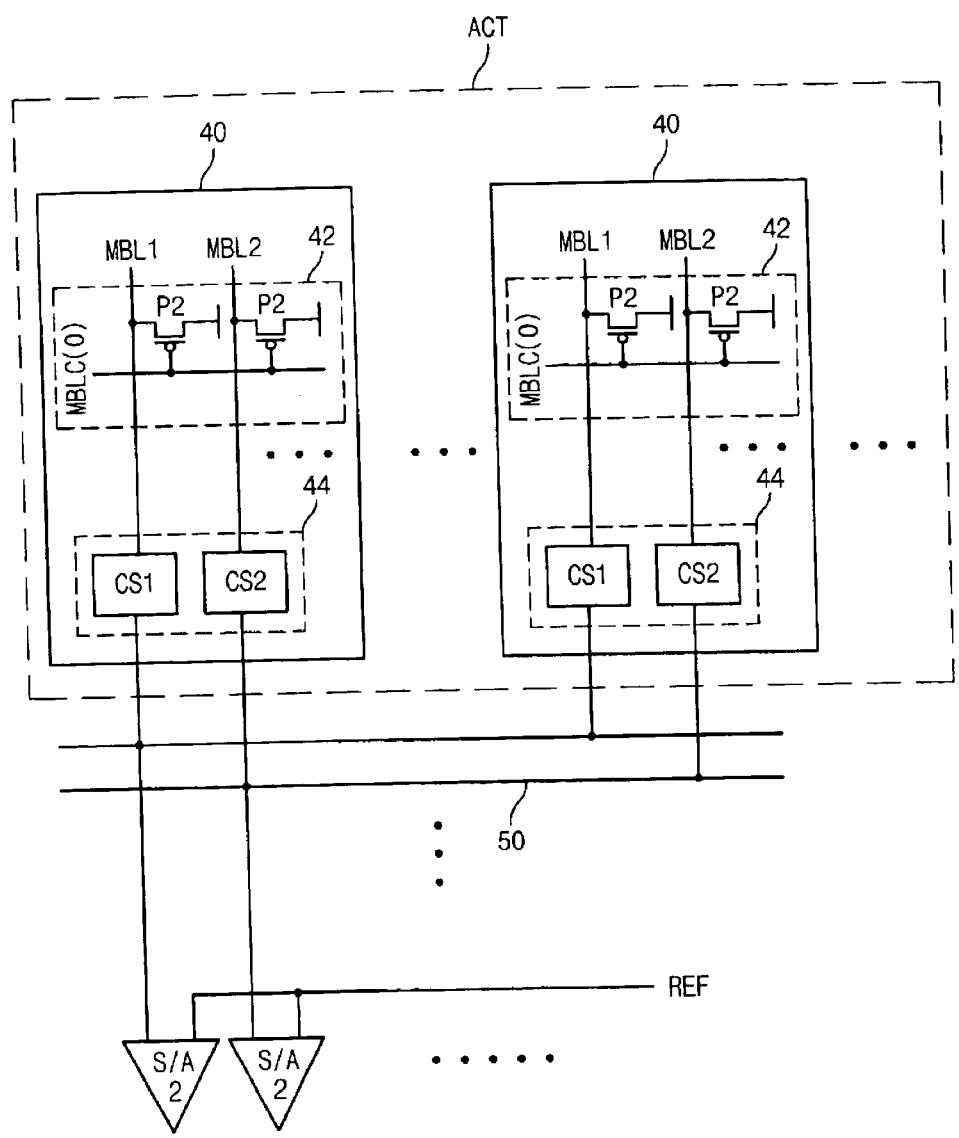

FIG. 18 is a diagram illustrating an example of all cell array blocks of FIG. 13 each further comprising the main bitline sensing load units 42. In an embodiment of FIG. 18, all the activated cell array blocks 40 arranged horizontally comprise the main bitline sensing load units 42 connected to the main bitlines MBL, respectively.

Figure 19:
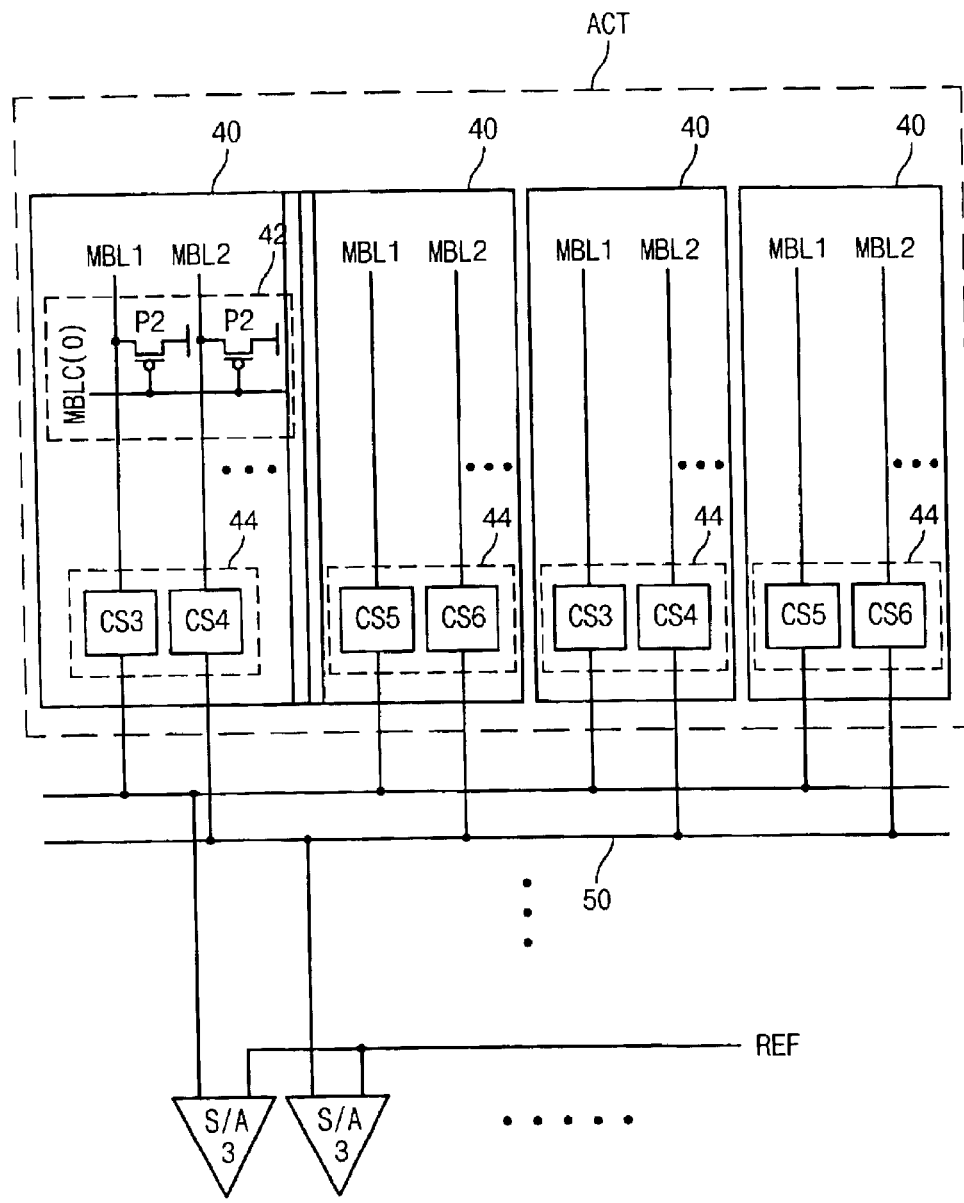
FIGS. 19 to 21 are diagrams illustrating an example of a cell array applied to FIG. 14.

FIG. 19 is a diagram illustrating an example of the cell array block 40 of FIG. 14 further comprising one main bitline sensing load unit 42.

In an embodiment of FIG. 19, one of the four activated cell array blocks 40 arranged horizontally comprises the main bitlins sensing load unit 42 connected to the main bitlines MBL. Here, the main bitline sensing load unit 42 can be selectively connected depending on characteristics of the cell.

As a result, since the maximum value of the sensing margin is secured depending on the main bitline sensing load unit 42 connected to the activated cell array block 40, the voltage of the main bitline MBL can be determined.

Figure 20:
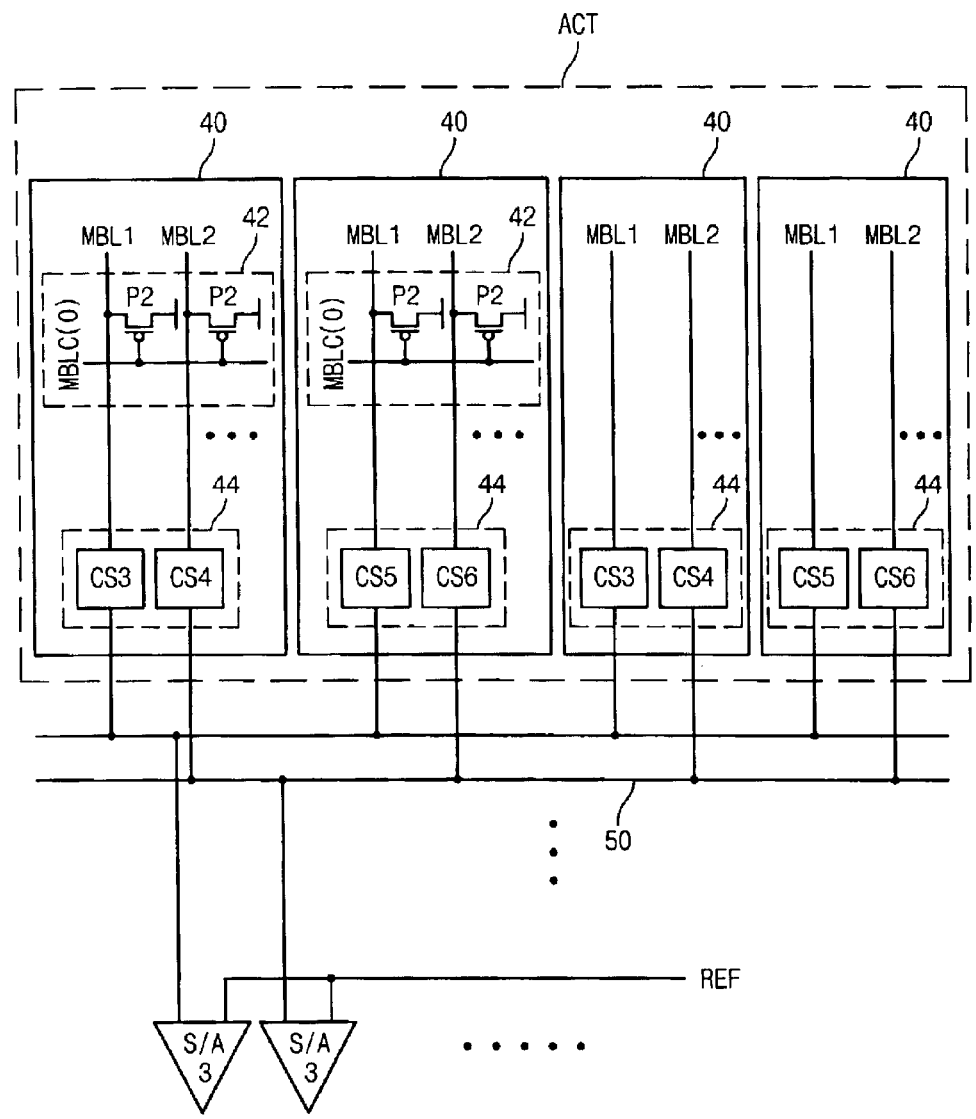

FIG. 20 is a diagram illustrating an example of the two cell array blocks 40 of FIG. 14 each further comprising one main bitline sensing load unit 42. In an embodiment of FIG. 20, two of the four activated cell array blocks 40 arranged horizontally comprise the main bitline sensing load unit 42 connected to the main bitlines MBL.

Figure 21:
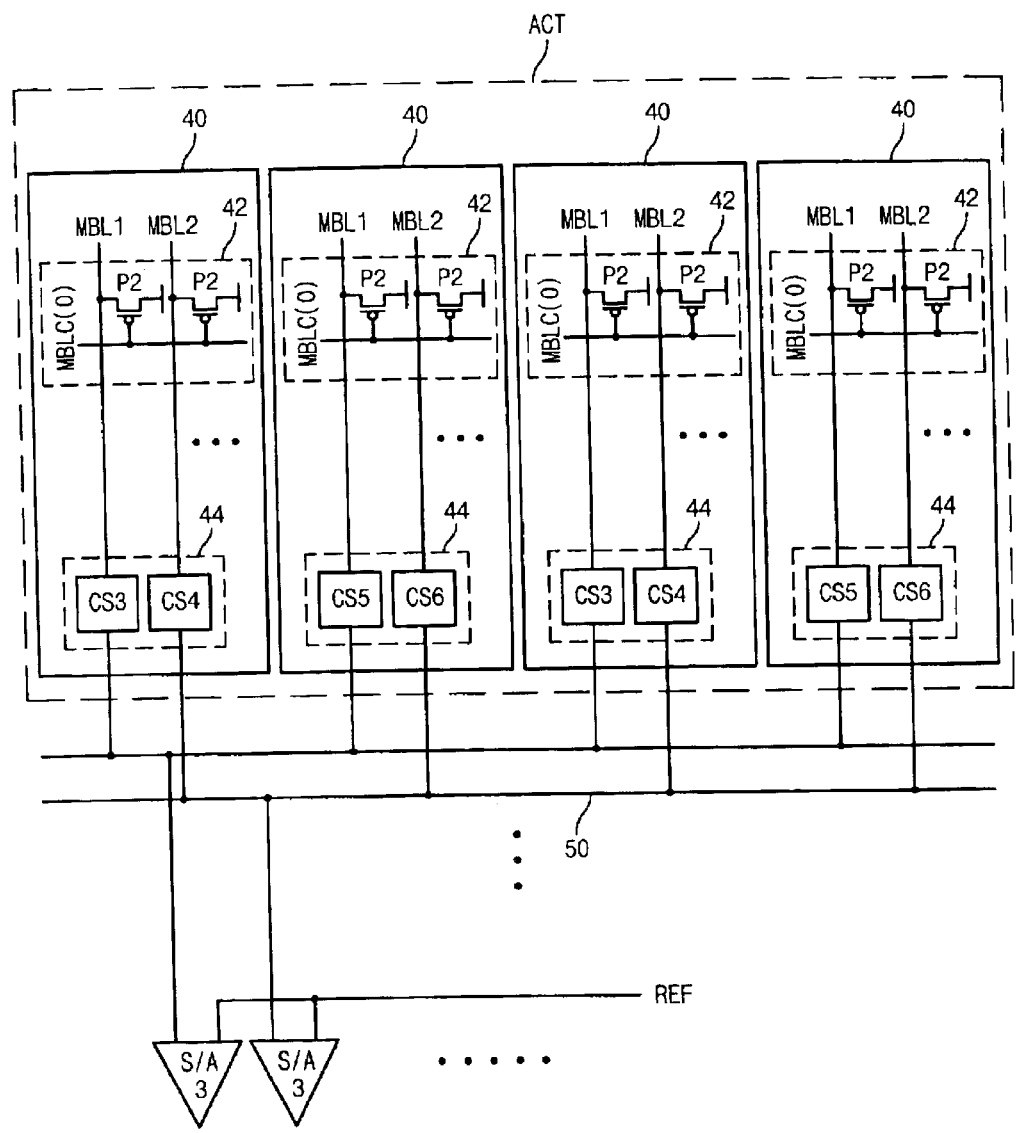

FIG. 21 is a diagram illustrating an example of all cell array blocks 40 of FIG. 14 each further comprising one main bitline sensing load unit 42. In an embodiment of FIG. 21, all the activated cell array blocks 40 arranged horizontally comprise the main bitline sensing load unit 42 connected to the main bitlines MBL, respectively.

Figure 22:
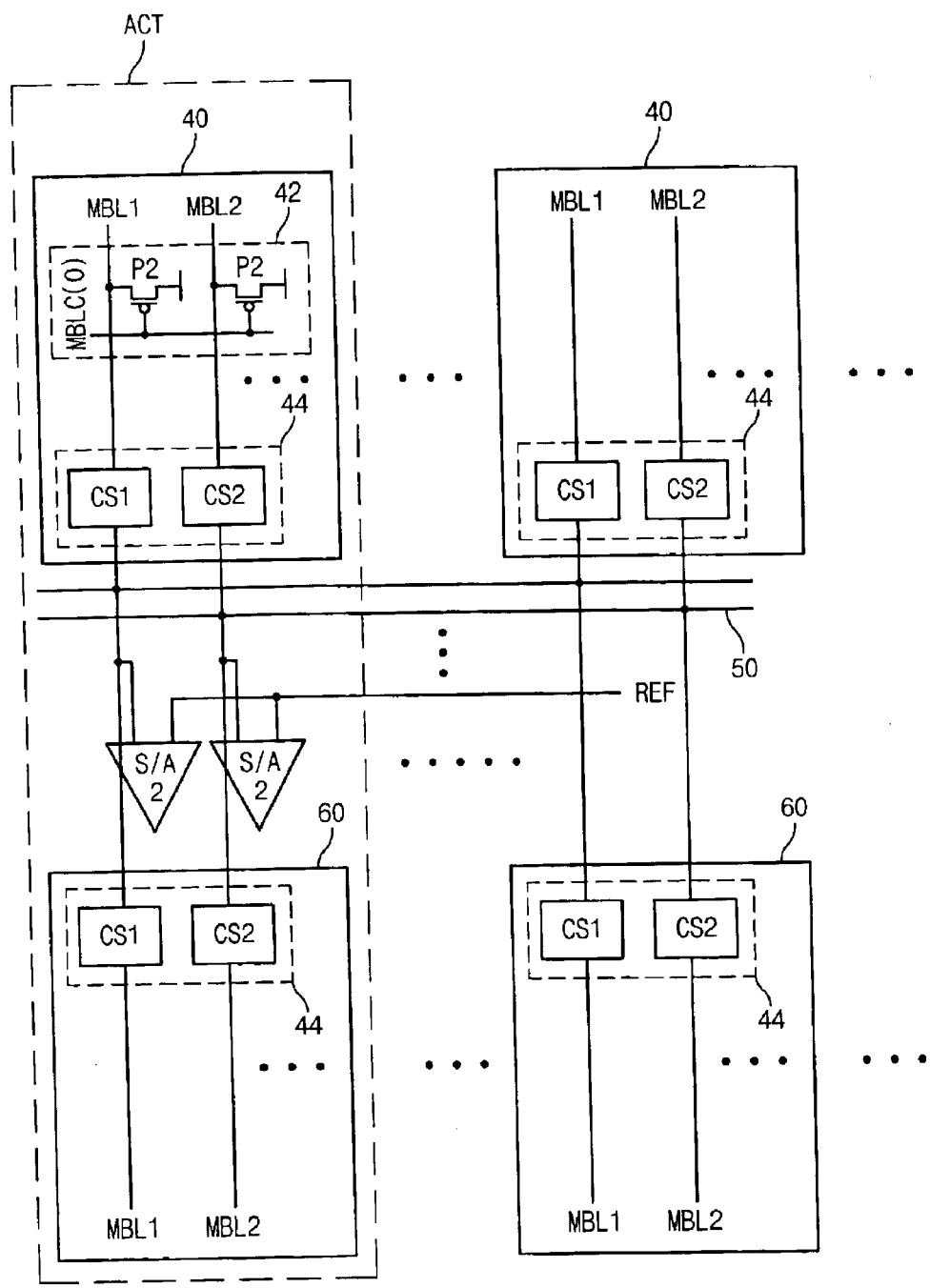
FIGS. 22 and 23 are diagrams illustrating an example of a cell array applied to FIG. 15.

FIG. 22 is a diagram illustrating an example of one cell array block 40 of FIG. 15 further comprising one main bitline sensing load unit 42. In an embodiment of FIG. 22, one upper cell array block 40 of the two activated cell array blocks 40 and 60 arranged vertically comprises the main bitline sensing load unit 42 connected to the main bitlines MBL. Here, the main bitline sensing load unit 42 can be selectively connected depending on characteristics of the cell.

As a result, since the maximum value of the sensing margin is secured depending on the main bitline sensing load unit 42 connected to the activated cell array block 40, the voltage of the main bitline MBL can be determined.

Figure 23:
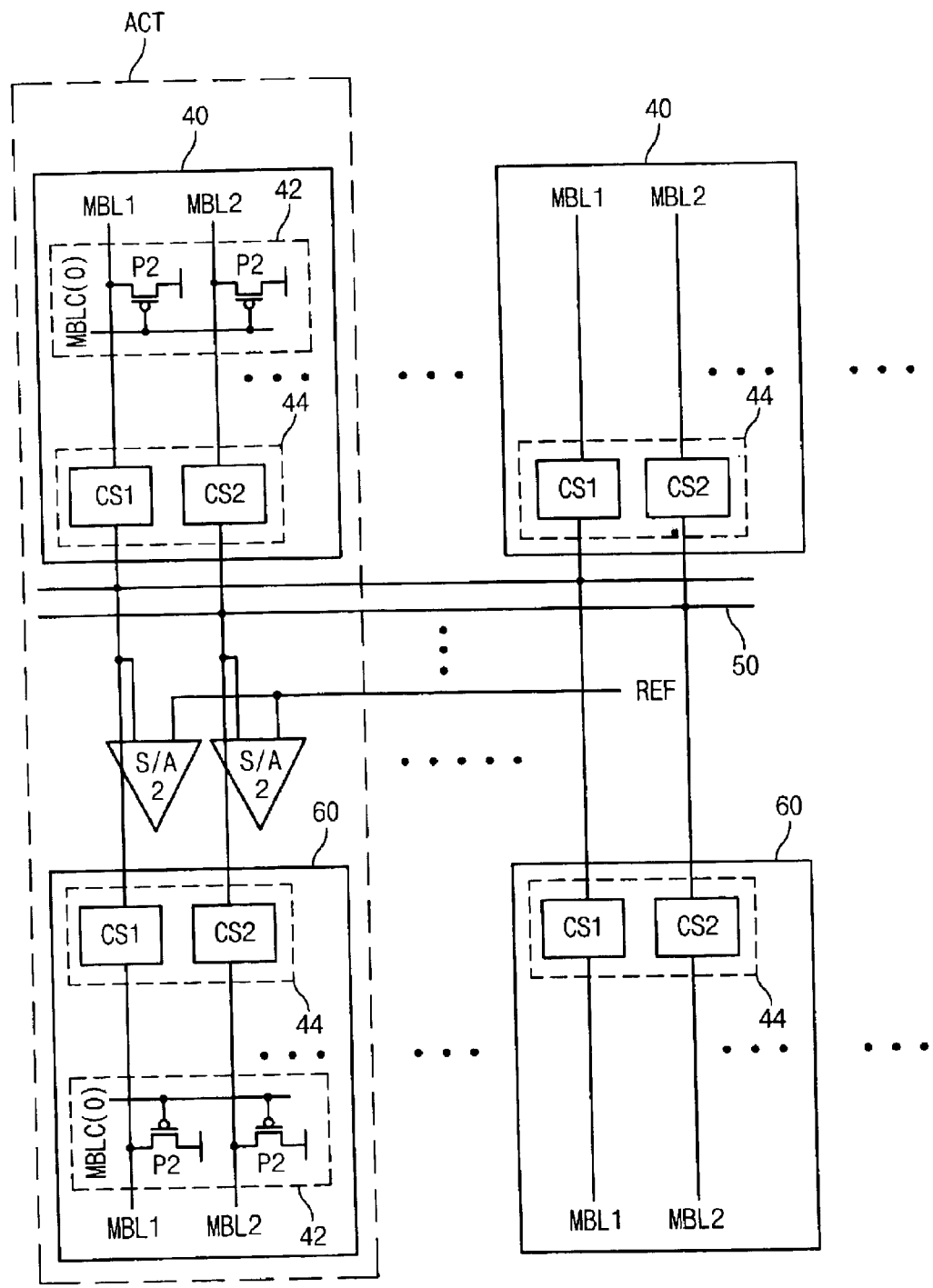

FIG. 23 is a diagram illustrating an example of the cell array blocks 40 and 60 of FIG. 15 each further comprising one main bitline sensing load unit 42. In an embodiment of FIG. 23, each of the activated cell array blocks 40 and 60 arranged vertically comprises the main bitline sensing load units 42 connected to the main bitlines MBL.

Figure 24:
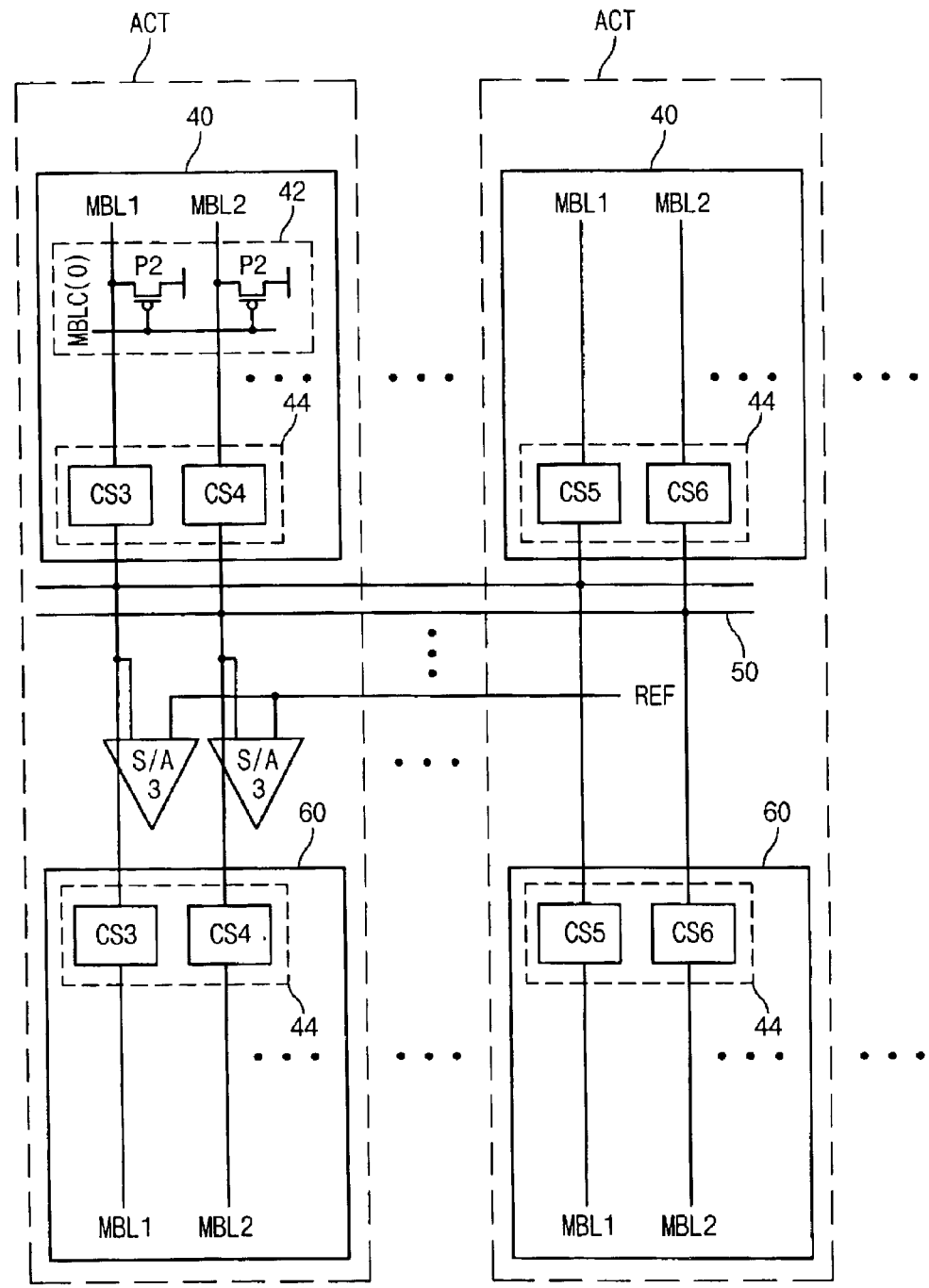
FIGS. 24 to 26 are diagrams illustrating an example of a cell array applied to FIG. 16.

FIG. 24 is a diagram illustrating an example of the cell array block 40 of FIG. 16 further comprising one main bitline sensing load unit 42. In an embodiment of FIG. 24, one upper cell array block 40 of the four activated cell array blocks 40 and 60 arranged horizontally and vertically comprises the main bitline sensing load unit 42 connected to the main bitlines MBL.

Figure 25:
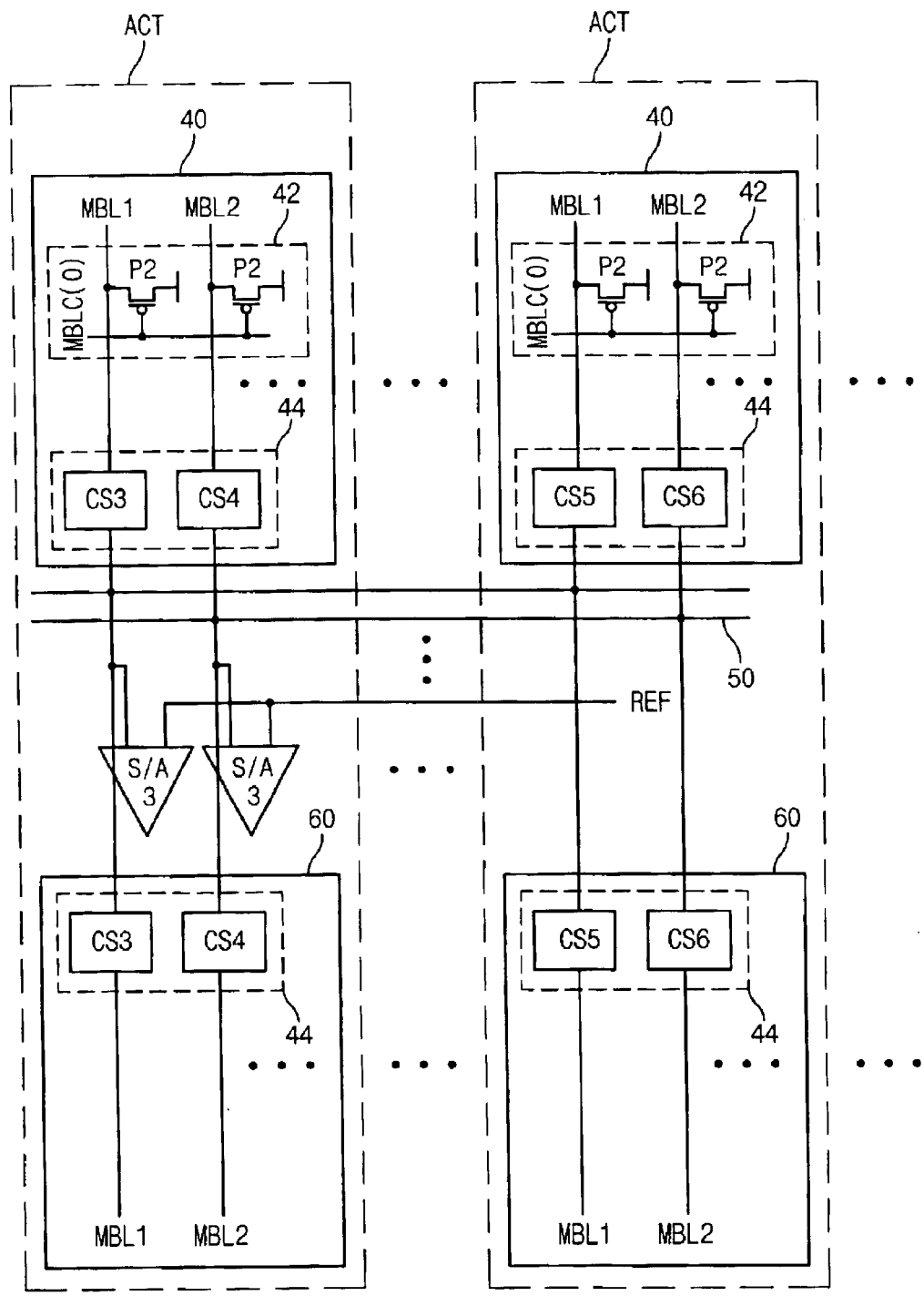

FIG. 25 is a diagram illustrating an example of two cell array blocks 40 of FIG. 16 further comprising two main bitline sensing load units 42. In an embodiment of FIG. 25, two upper cell array blocks 40 of the four activated cell array blocks 40 and 60 arranged horizontally and vertically comprise the main bitline sensing load units 42 connected to the main bitlines MBL.

Figure 26:
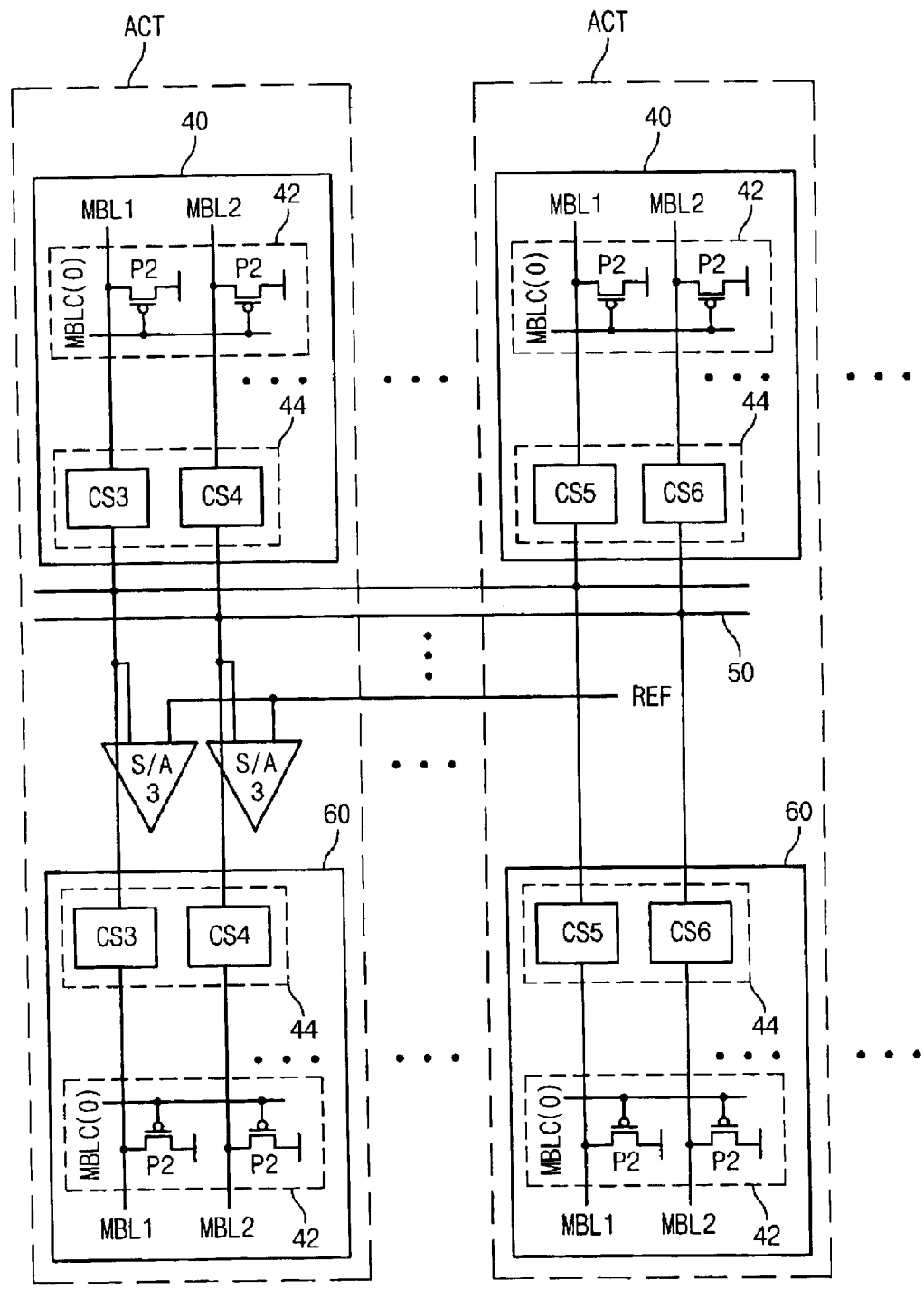

FIG. 26 is a diagram illustrating an example of four cell array blocks 40 and 60 of FIG. 16 further comprising four main bitline sensing load units 42. In an embodiment of FIG. 26, all the activated cell array blocks 40 and 60 arranged vertically and horizontally comprise the main bitline sensing load units 42 connected to the main bitlines MBL, respectively.

Figure 27:
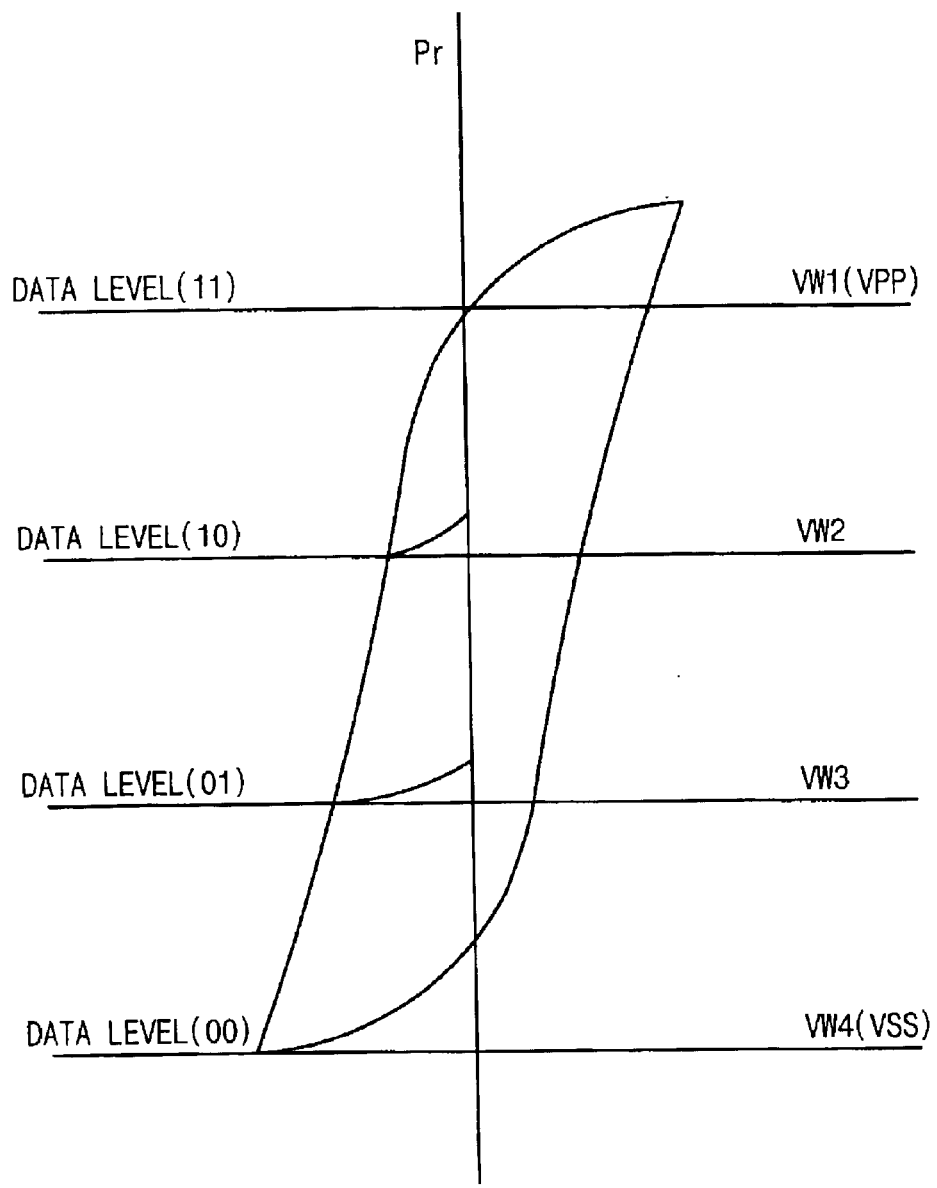
FIG. 27 is a characteristic curve illustrating a 2 bit recording level according to an embodiment of the present invention.

FIG. 27 is a characteristic curve illustrating a 2 bit recording level according to an embodiment of the present invention.

$4(2^2)$ level data is required to store 2 bits in a memory cell. That is, data levels of 00, 01, 10 and 11 are required. Thus, in order to store data of four levels in a cell, a voltage level is divided into VW1 (VPP), VW2, VW3 and VW4 (VSS), and stored.

Hereinafter, the write operation of 2 bit data is described.

If a VW1(VPP) voltage is applied to a cell while the plate line PL is at the ground voltage VSS level, hidden data "1" is written in all cells.

Next, when a pumping voltage VPP is applied to the plateline PL, a voltage VW2 is applied to the sub bitline SBL and the main bitlines MBL to store a data level 10. As a result, a voltage VW1–VW2 is applied to the plateline PL and the sub bitline SBL. That is, the charge initially stored in the cell is reduced to that corresponding to the voltage VW1–VW2. Thus, a data level 11 transits to the data level 10.

Thereafter, data levels 01 and 00 are stored in the cell by applying different voltages VW3 and VW4 to the sub bitline SBL and the main bitline MBL.

Figure 28:
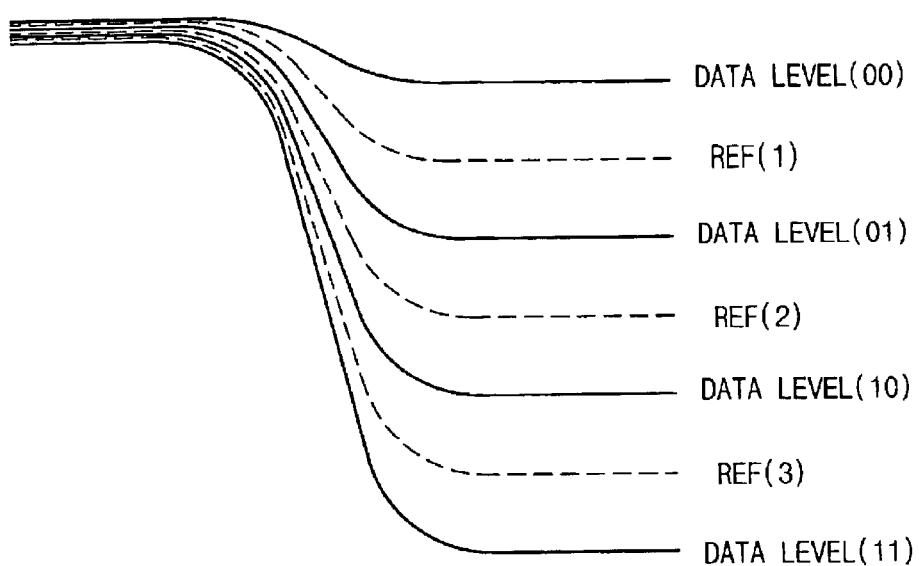
FIG. 28 is a characteristic curve illustrating a 2 bit sensing level according to an embodiment of the present invention.

FIG. 28 is a characteristic curve illustrating a 2 bit sensing level according to an embodiment of the present invention.

2 bit data having different data levels are stored in a memory cell. Thus, levels of cell data outputted through the sub bitline SBL have four sensing voltage levels.

The four data levels sensed in the main bitline MBL are 11, 10, 01 and 00. The sense amplifier S/A compares and amplifies the four data levels with three reference voltages REF levels. The levels of reference voltages REF1, REF2 and REF3 are the same as the number of the sense amplifiers S/A.

Figure 29:
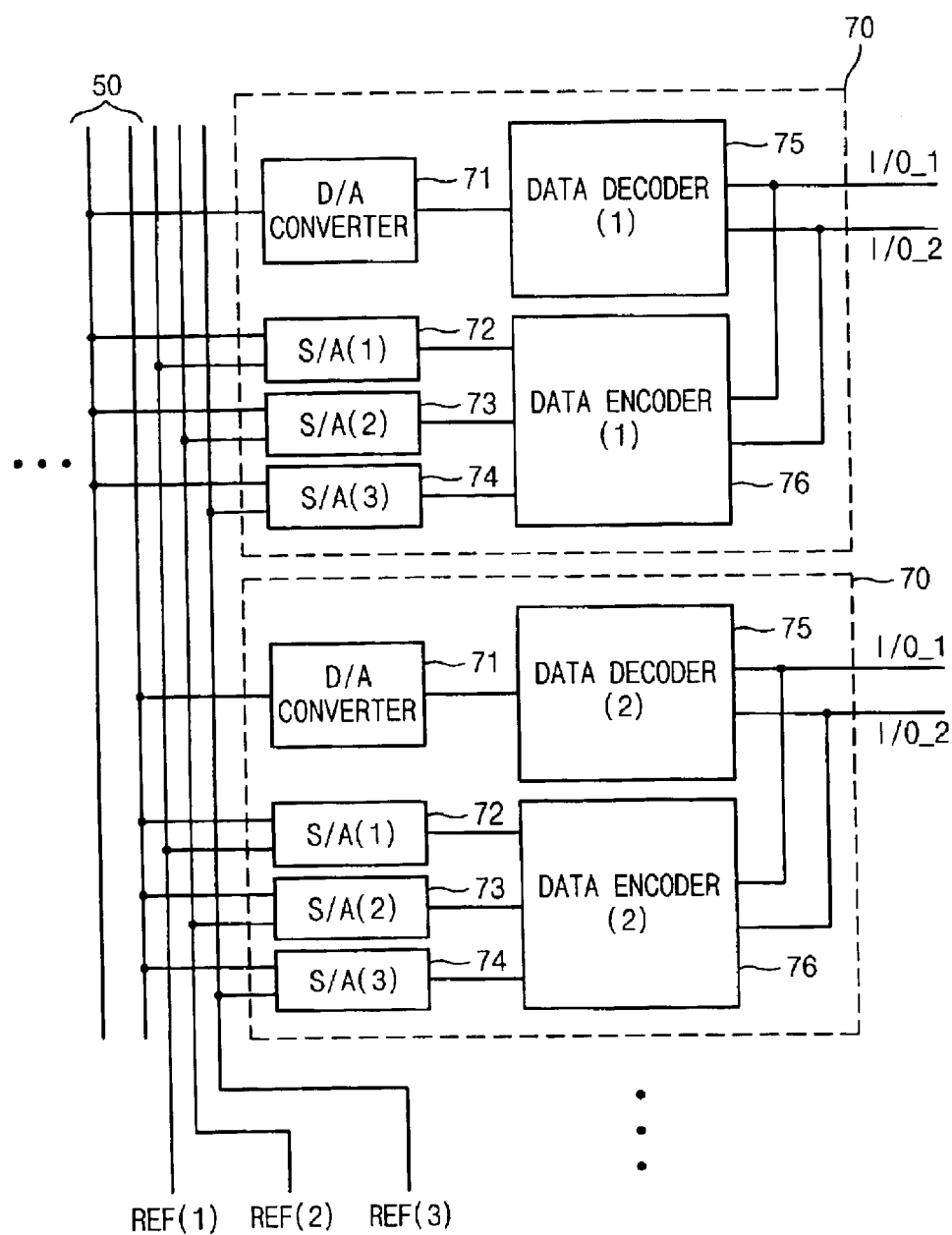
FIG. 29 is a diagram illustrating a sensing controller for 2 bit storage according to an embodiment of the present invention.

FIG. 29 is a diagram illustrating a sensing controller 70 for 2 bit storage according to an embodiment of the present invention.

Each sensing controller 70 comprises a D/A(Digital/Analog) converter 71, a plurality of sense amplifiers 72~74, a data decoder 75 and a data encoder 76.

In a read mode, the sense amplifiers 72~74 compares and amplifies the reference voltage REF level with a plurality of data levels sensed from the common data bus unit 50. The sense amplifiers 72~74 receives the different reference voltages REF1~REF3 to identify the data levels. The data encoder 76 encodes a plurality of data levels applied from the sense amplifiers 72~74 to output 2 bit data into data input/output buses I/O_0 and I/O_1.

In a write or restore mode, 2 bit data applied from the data input/output buses I/O_0 and I/O_1 are inputted into the data decoder 75. Here, in the write mode, input data inputted from the data input/output buses I/O_0 and I/O_1 are inputted into the data decoder 75. In the restore mode, data outputted from the data encoder 76 are feedback inputted into the data decoder 75 through the data input/output buses I/O_0 and I/O_1.

The data decoder 75 decodes the inputted 2 bit data to output the decoded data into the D/A converter 71. The D/A converter 71 converts the inputted 2 bit data into analog signals to output four data levels VW1, VW2, VW3 and VW4 into the common data bus unit 50.

Figure 30:
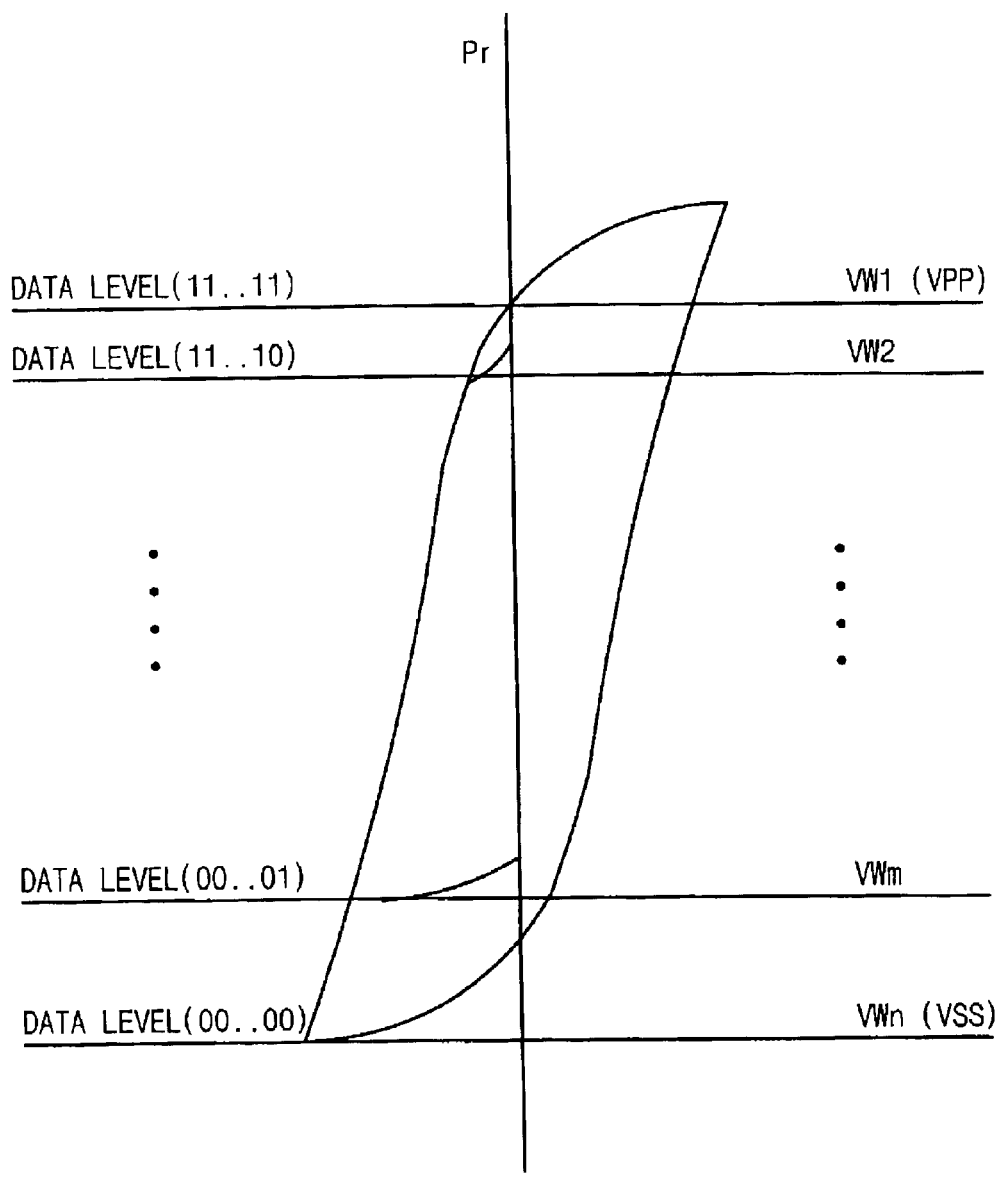
FIG. 30 is a characteristic curve illustrating an M bit recording level according to an embodiment of the present invention.

FIG. 30 is a characteristic curve illustrating an M bit recording level according to an embodiment of the present invention.

$2^m$ level data are required to stored m bits in a memory cell. That is, data levels of (00 . . . 00), (00 . . . 01), . . . , (11 . . . 10) and (11 . . . 11) are required. To store $2^m$ level data in the cell, a voltage level is divided into n voltages such as VW1(VPP), VW2~VWm and VWn(VSS).

Hereinafter, the write operation of m bit data is described.

If a VW1(VPP) voltage is applied to the cell while the plateline PL is at the ground voltage VSS level, hidden data "1" is written in all cells.

While the pumping voltage VPP is applied to the plateline PL, the voltage VW2 is applied to the sub bitline SBL and the main bitline MBL to store the data level (11 . . . 00). As a result, a voltage VW1–VW2 is applied to the plateline PL and the sub bitline SBL. That is, the charge initially stored in the cell is reduced to that corresponding to the voltage VW1–VW2. Thus, the data level (11 . . . 11) transits to the data level (11 . . . 10).

Thereafter, a plurality of data levels can be stored in the cell by applying different voltages VW3~VWn to the sub bitline SBL and the main bitline MBL.

Figure 31:
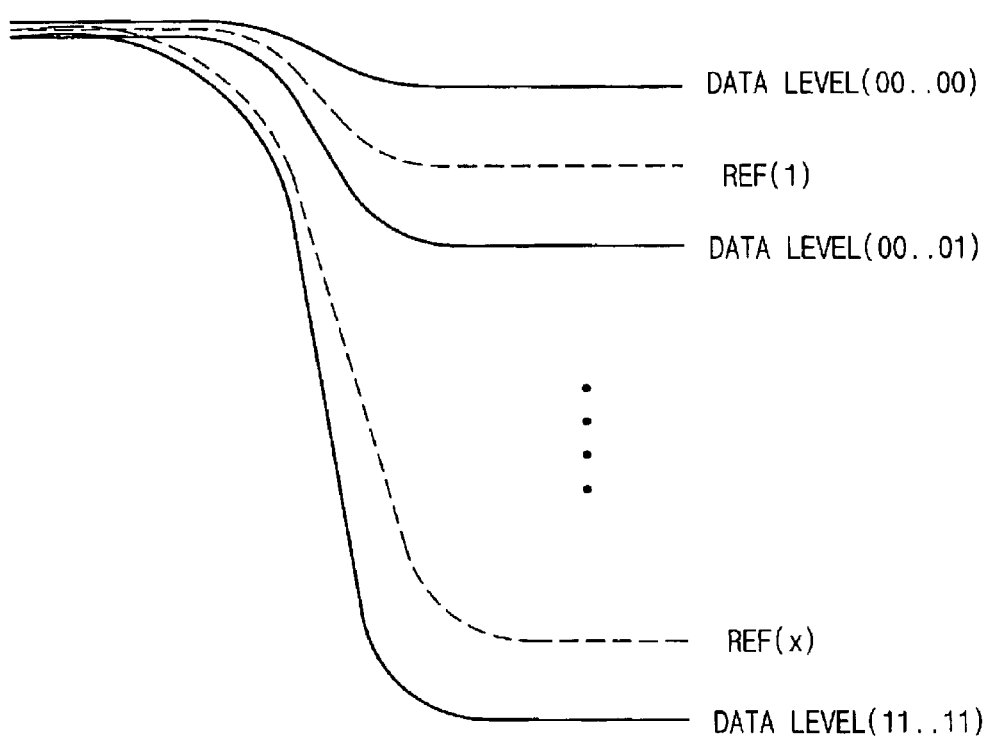
FIG. 31 is a characteristic curve illustrating an M bit sensing level according to an embodiment of the present invention.

FIG. 31 is a characteristic curve illustrating an M bit sensing level according to an embodiment of the present invention.

A plurality of data having different data levels are stored in a memory cell. Thus, levels of cell data outputted through the sub bitline SBL have $2^m$ sensing voltage levels.

$2^m$ data levels sensed in the main bitline MBL are (00 . . . 00), (00 . . . 01), . . . , (11 . . . 10) and (11 . . . 11). The sense amplifier S/A compares and amplifies m data levels with $2^m-1$ (x is the number of $2^m-1$) reference voltage REF levels. Here, the voltage levels of the reference voltage REF1~REFx are the same as the number of the sense amplifiers S/A.

Figure 32:
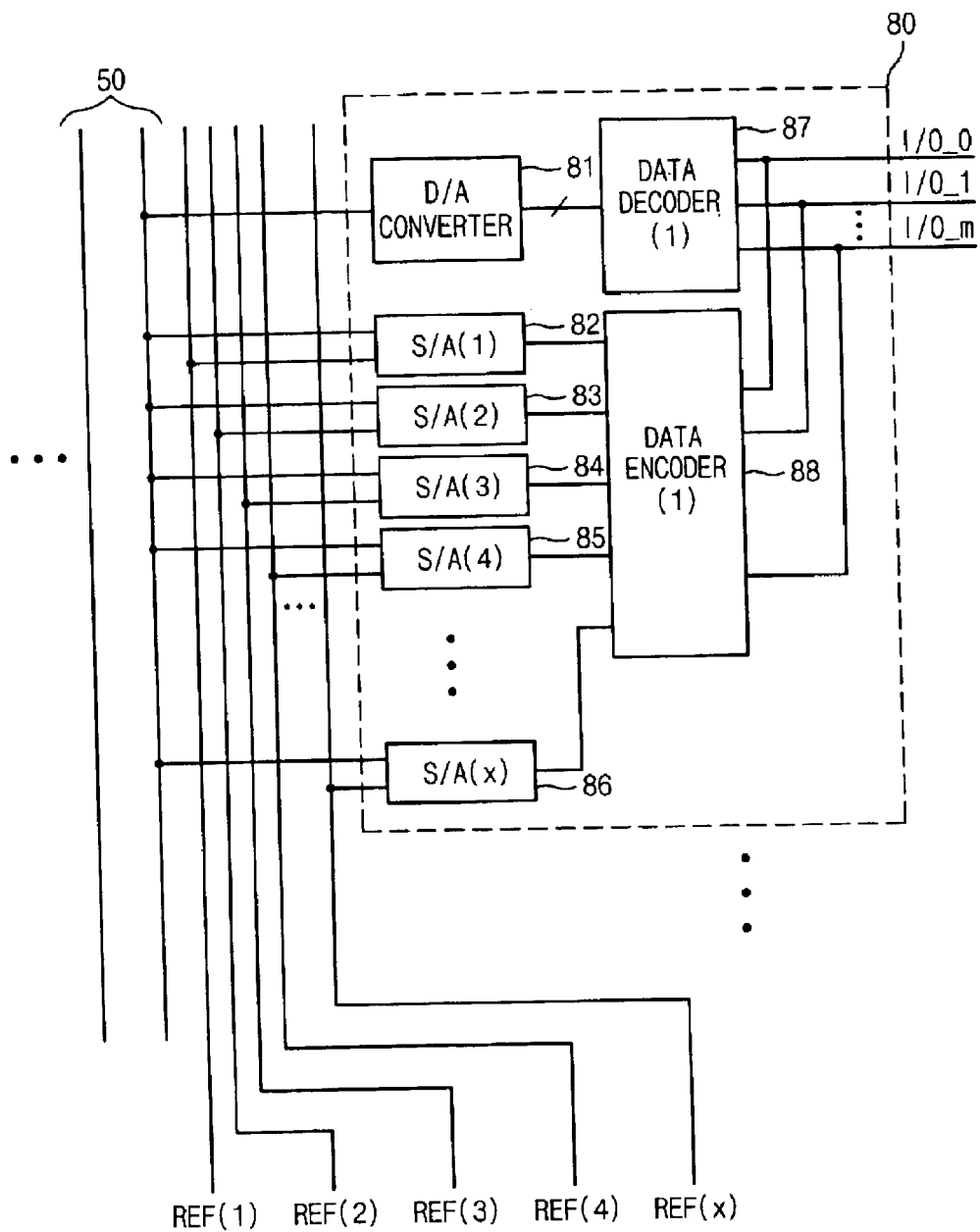
FIG. 32 is a diagram illustrating a sensing controller for M bit storage according to an embodiment of the present invention.

FIG. 32 is a diagram illustrating a sensing controller 80 for M bit storage according to an embodiment of the present invention.

The sensing controller 80 comprises a D/A(Digital/Analog) converter 81, a plurality of sense amplifiers 82~86, a data decoder 87 and a data encoder 88.

In a read mode, the sense amplifiers 82~86 compare and amplify a plurality of reference voltages REF levels with a plurality of data levels sensed from the common data bus unit 50. Here, $2^m-1$ sense amplifiers 82~86 receive different reference voltages REF1~REFx to identify the data levels. The data encoder 88 encodes a plurality of data levels applied from the sense amplifiers 82–86, and outputs m bit data into the data input/output buses I/O_0~I/O_m.

In a write or restore mode, the m bit data applied from the data input/output buses I/O_0~I/O_m are inputted into the data decoder 87. Here, in the write mode, input data inputted from the data input/output buses I/O_0~I/O_m are inputted into the data decoder 87. In the restore mode, data outputted through the data encoder 88 are feedback inputted into the data decoder 87 through the data input/output buses I/O_0–I/O_m.

The data decoder 87 decodes m bit data to output the decoded data into the D/A converter 81. The D/A converter 81 converts the m bit data into analog signals to output $2^m$ (n is the number of $2^m$) data levels VW1~VWn into the common data bus unit 50.

Figure 33:
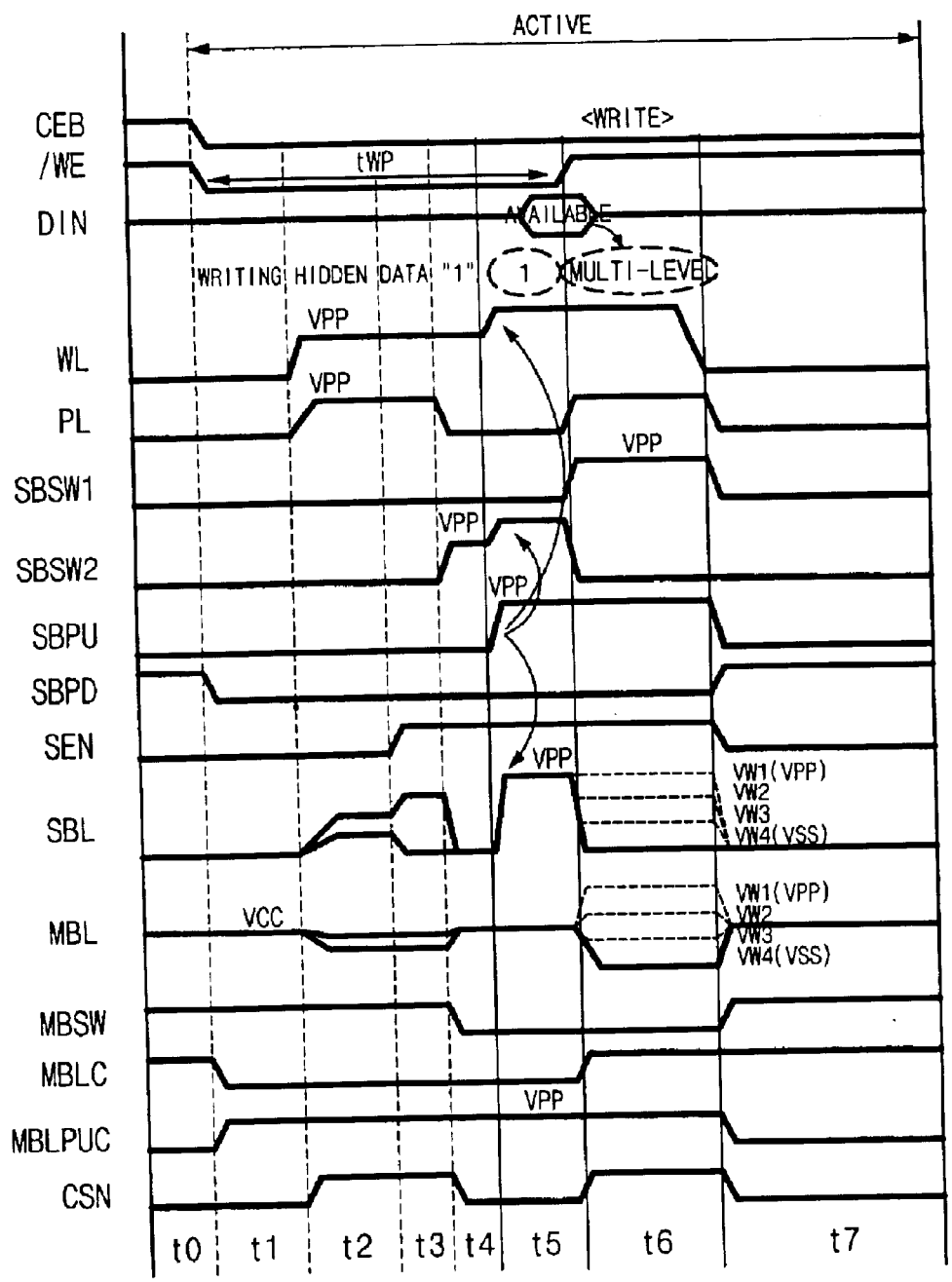
FIG. 33 is a timing operation illustrating the write operation of a nonvolatile ferroelectric memory device having a multi-bit control function according to an embodiment of the present invention.

FIG. 33 is a timing operation illustrating the write operation of a nonvolatile ferroelectric memory device having a multi-bit control function according to an embodiment of the present invention.

When an interval t1 starts, a chip selecting signal CSB and a write enable signal /WE are disabled to a low level, and the write mode becomes active. Here, the sub bitline pull-down signal SBPD and the main bitline control signal MBLC are disabled to a low level. The main bitline pull-up control signal MBLPUC is enabled to a high level.

Thereafter, when an interval t2 starts, the wordline WL and the plateline PL are enabled to the pumping voltage VPP, and the voltage level of the sub bitline SBL rises. Then, the column selecting signal CSN is enabled to connect the main bitline MBL to the common data bus unit 50.

Next, when an interval t3, a data sensing interval, starts, a sense amplifier enable signal SEN is enabled to apply cell data in the main bitline MBL.

When an interval t4 starts, the plateline PL is disabled to a low level and the sub bitline selecting signal SBSW2 is enabled to a high level. The sub bitline SBL and the column selecting signal CSN are disabled to a low level.

In an interval t5, the hidden data "1" is written. When the interval t5 starts, a wordline WL voltage rises. As the sub bitline pull-up signal SBPU is enabled, the sub bitline selecting signal SBSW2 is enabled to the pumping voltage VPP level. As a result, the voltage level of the sub bitline SBL rises to the pumping voltage VPP level.

During the intervals t4 and t5 where the column selecting signal CSN is at a low level, the main bitline MBL is pulled up to the power voltage VCC in response to the main bitline control signal MBLC regardless of data applied from the common data bus unit 50.

Next, in an interval t6, multi-level data can be written as the write enable signal /WE is enabled. When the interval t6 starts, the plateline PL is re-enabled to the high level. Then, the sub bitline selecting signal SBSW1 rises to the pumping voltage VPP level, and the sub bitline selecting signal SBSW2 is disabled. Here, the main bitline control signal MBLC and the column selecting signal CSN are enabled to a high level.

During an interval where the sub bitline selecting signal SBSW1 is at the pumping voltage VPP level, a plurality of data can be written in a memory cell depending on multi voltages VW~VW4 levels applied to the sub bitline SBL and the main bitline MBL.

When an interval t7 starts, the wordline WL, the plateline PL, the sub bitline selecting signal SBSW1 and the sub bitline pull-up signal SBPU are disabled. Then, the sub bitline pull-down signal SBPD is enabled, and the sense amplifier enable signal SEN is disabled. Also, the main bitline pull-up control signal MBLPUC is disabled to precharge the main bitline MBL to the power voltage VCC level. Here, the column selecting signal CSN is disabled to disconnect the main bitline MBL to the common data bus unit 50.

Figure 34:
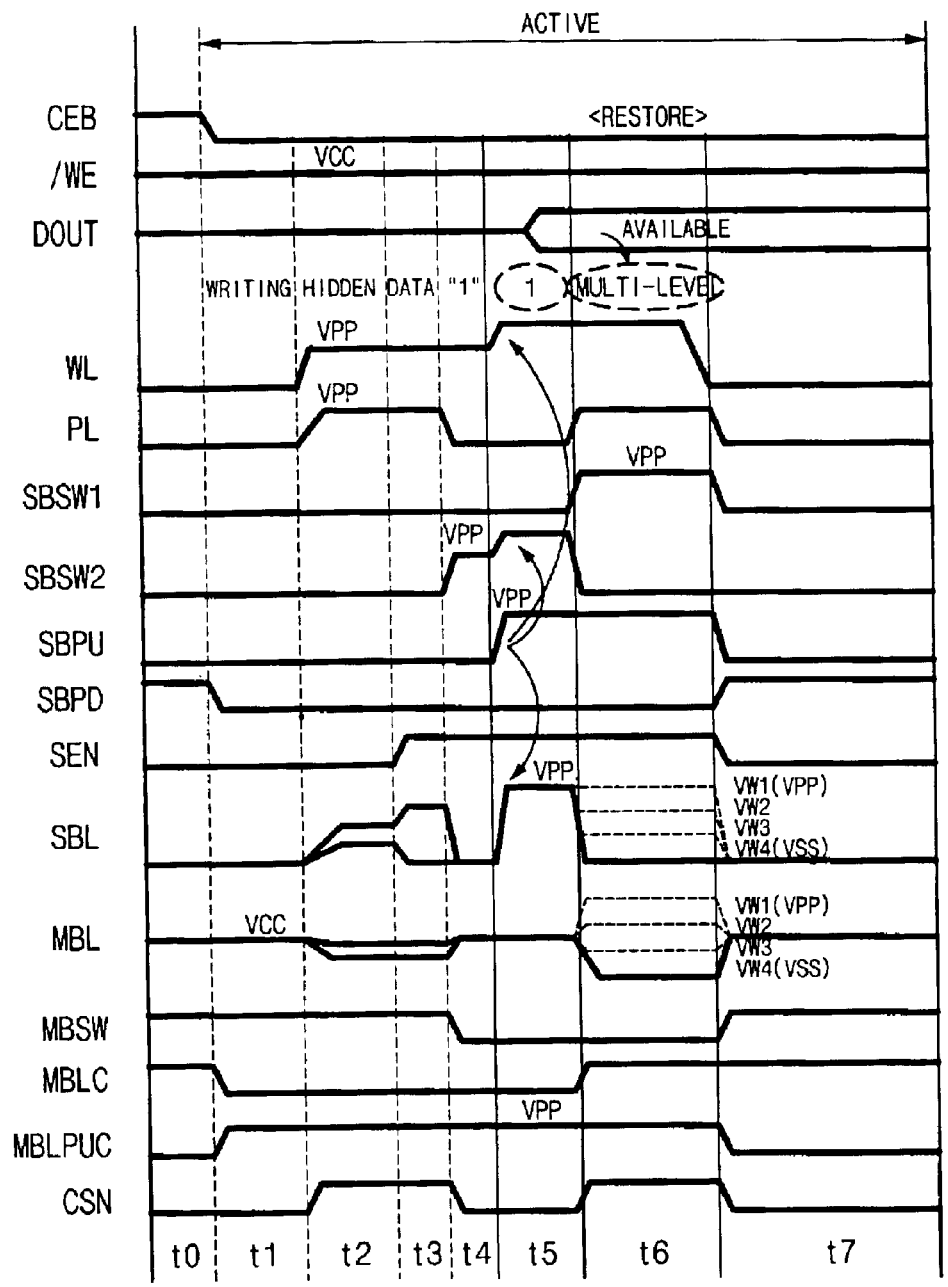
FIG. 34 is a timing operation illustrating the read operation of a nonvolatile ferroelectric memory device having a multi-bit control function according to an embodiment of the present invention.

FIG. 34 is a timing operation illustrating the read operation of a nonvolatile ferroelectric memory device having a multi-bit control function according to an embodiment of the present invention.

In a read mode, the write enable signal /WE is maintained at the power voltage VCC level. In intervals t2 and t3, data are sensed. In an interval t5, hidden data "1" is written, and data output available interval is maintained after the interval t5.

The cell array block 40 does not write input data externally inputted through the common data bus unit 50 in a cell but restores read data stored in the timing data register array unit 30 in the cell.

Thereafter, in an interval t6, a plurality of multiple level data are restored. That is, during an interval where the sub bitline selecting signal SBSW1 is at a high level, voltages VW~VW4 having multiple levels are applied to the sub bitline SBL and the main bitline MBL, respectively, by feedback decoder loop. As a result, multiple levels are restored in the memory cell.

In addition, during the interval t6, the plurality of data levels stored in the cell array block 40 are sensed and outputted through the common data bus 50.

As described above, in a nonvolatile ferroelectric memory device having a multi-bit control function according to an embodiment of the present invention, stable sensing values of data having a small distribution can be obtained by using average characteristics of a plurality of selected cells. Additionally, since two or more cells are simultaneously selected and a plurality of bits are read/written in the cells depending on stabilized charge, the operation speed of a chip can be improved.

What is claimed is:

1. A nonvolatile ferroelectric memory device having a multi-bit control function, comprising:

a plurality of memory cells connected to a plurality of bitlines to be activated simultaneously;

a plurality of column selecting switches connected one by one to the plurality of bitlines;

a common data bus unit connected in common to the plurality of column selecting switches; and a sense amplifier for comparing a reference voltage level with a voltage level of averaged data applied through the common data bus unit and amplifying the comparison result, wherein the averaged data is the average of charge values applied from the plurality of memory cells via the plurality of column selecting switches.

2. The device according to claim 1, wherein the plurality of data are the same data.

3. The device according to claim 1, wherein each memory cell comprises a switching device and a nonvolatile ferroelectric capacitor, the switching device is connected between a bitline and a first electrode of the nonvolatile ferroelectric capacitor, and a second electrode of the nonvolatile ferroelectric capacitor is connected to a plateline.

4. The device according to claim 3, wherein the plurality of memory cells are arranged vertically and horizontally, and a pair of bitlines are connected to the same wordline and the same plateline.

5. A nonvolatile ferroelectric memory device having a multi-bit control function, comprising:

a plurality of cell array blocks to be activated simultaneously, comprising a plurality of column selecting switches connected one by one to a plurality of main bitlines;

a common data bus unit connected in common to the plurality of cell array blocks; and a plurality of sense amplifiers for comparing reference voltage levels with voltage levels of a plurality of averaged data applied through the common data bus unit and amplifying the comparison data to output multi-bit data having different voltage levels;

wherein the plurality of cell array blocks are arranged side by side at a half side divided by the common data bus unit.

6. The device according to claim 5, wherein the plurality of averaged data are averages of charge values applied from the plurality of cell array blocks.

7. The device according to claim 6, wherein the plurality of data applied from the plurality of cell array blocks to one sense amplifier are the same data.

8. The device according to claim 5, wherein each of the plurality of cell array blocks further comprises a plurality of main bitline sensing load units for selectively providing power voltage to the plurality of main bitlines to control sensing load of the main bitlines.

9. The device according to claim 5, wherein each of the plurality of cell array blocks applies a number of $2^m$ write voltages to memory cells to write m bit data in a write mode.

10. The device according to claim 5, wherein each of the plurality of sense amplifiers compares and amplify a number of $2^m-1$ reference voltage levels with the plurality of averaged data when m bit data are sensed in a read mode.

11. The device according to claim 5, further comprising:

a data encoder for encoding the multi-bit data having a plurality of different data levels to output n bit data into a data input/output bus;

a data decoder for decoding the n bit data applied from the data input/output bus; and a digital/analog converter for converting a voltage level of data decoded in the data decoder into the common data bus unit.

12. The device according to claim 5, further comprising:

a timing data register array unit for storing data read in the plurality of cell array blocks through the common data bus unit in a read mode and storing input data in a write mode; and a timing data buffer unit for buffering read data stored in the timing data register array unit and outputting the input data into the timing data register array unit.

13. A nonvolatile ferroelectric memory device having a multi-bit control function, comprising:

a plurality of cell array blocks to be activated simultaneously, comprising a plurality of column selecting switches connected one by one to a plurality of main bitlines;

a common data bus unit connected in common to the plurality of cell array blocks; and a plurality of sense amplifiers for comparing and amplifying different reference voltage levels with voltage levels of a plurality of averaged data applied from the plurality of cell array blocks and outputting multi-bit data having different voltage levels;

wherein the plurality of cell array blocks are arranged side by side at both half-sides divided by the common data bus unit.

14. The device according to claim 13, wherein the plurality of averaged data are averages of charge values applied from the plurality of cell array blocks.

15. The device according to claim 13, wherein the plurality of data applied from the plurality of cell array blocks to one sense amplifier are the same data.

16. The device according to claim 13, wherein each of the plurality of cell array blocks further comprises a plurality of main bitline sensing load units for selectively providing power voltage to the plurality of main bitlines in response to a main bitline control signal to control main bitline sensing load.

17. The device according to claim 13, wherein each of the plurality of cell array blocks applies a number of $2^m$ write voltages to memory cells sequentially to write m bit data in a write mode.

18. The device according to claim 13, wherein each of the plurality of sense amplifiers compares and amplify a number of $2^m-1$ reference voltage levels with voltage levels of the plurality of averaged data when m bit data are sensed in a read mode.

19. The device according to claim 13, further comprising:
  a data encoder for encoding the multi-bit data having a plurality of different data levels to output n bit data into a data input/output bus;
  a data decoder for decoding n bit data applied from the data input/output bus; and
  a digital/analog converter for converting voltage levels of data decoded in the data decoder into the common data bus unit.

20. The device according to claim 13, further comprising:
  a timing data register array unit for storing data read in the plurality of cell array blocks through the common data bus unit in a read mode and storing input data in a write mode; and
  a timing data buffer unit for buffering read data stored in the timing data register array unit, and outputting the input data into the timing data register array unit.

* * * * *